(12) United States Patent
Gao

(10) Patent No.: US 11,790,964 B1
(45) Date of Patent: Oct. 17, 2023

(54) DATA READING/WRITING CIRCUIT, METHOD, AND DEVICE

(71) Applicant: Changxin Memory Technologies, Inc., Anhui (CN)

(72) Inventor: Enpeng Gao, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 0 days.

(21) Appl. No.: 17/856,272

(22) Filed: Jul. 1, 2022

Related U.S. Application Data

(63) Continuation of application No. PCT/CN2022/092536, filed on May 12, 2022.

(30) Foreign Application Priority Data

Mar. 28, 2022 (CN) .......................... 202210311931.8

(51) Int. Cl.
*G06F 3/06* (2006.01)
*G11C 7/20* (2006.01)
*G11C 7/22* (2006.01)

(52) U.S. Cl.
CPC ............ *G11C 7/222* (2013.01); *G06F 3/0614* (2013.01); *G06F 3/0658* (2013.01); *G06F 3/0673* (2013.01)

(58) Field of Classification Search
CPC ..... G11C 7/222; G06F 3/0614; G06F 3/0658; G06F 3/0673
See application file for complete search history.

(56) References Cited

U.S. PATENT DOCUMENTS

| | | | |
|---|---|---|---|
| 10,916,278 B1* | 2/2021 | Chi | ...................... G11C 29/028 |
| 2002/0109528 A1 | 8/2002 | Toda | |

(Continued)

FOREIGN PATENT DOCUMENTS

| | | | |
|---|---|---|---|
| CN | 1435843 A | 8/2003 | |
| CN | 1507629 A | 6/2004 | |

(Continued)

OTHER PUBLICATIONS

PCT International Search Report and the Written Opinion dated Oct. 26, 2022, issued in related International Application No. PCT/CN2022/092536, with English translation (18 pages).

*Primary Examiner* — Khoa D Doan
(74) *Attorney, Agent, or Firm* — Sheppard Mullin Richter & Hampton LLP

(57) ABSTRACT

A data reading/writing circuit includes a controller and a memory. The memory is configured to decode an instruction based on a first clock signal from the controller and to sample data based on a second clock signal from the controller. The memory includes first and second storage modules, and a mode register that stores a second synchronization parameter, and a second delay circuit is disposed in the second storage module. In reading/writing data on the first storage module, the controller is configured to synchronize the first and second clock signals using a first synchronization parameter. In reading/writing data on the second storage module, the controller is configured to perform first synchronization on the first and second clock signals using the first synchronization parameter, and the memory is configured to perform second synchronization on the first and second clock signals using the second delay circuit and the second synchronization parameter.

19 Claims, 12 Drawing Sheets

(56) References Cited

U.S. PATENT DOCUMENTS

| | | |
|---|---|---|
| 2003/0142577 A1 | 7/2003 | Kumazaki et al. |
| 2004/0107326 A1 | 6/2004 | Janzen et al. |
| 2006/0233031 A1 | 10/2006 | Jakobs |
| 2015/0206560 A1 | 7/2015 | Kang et al. |
| 2020/0090716 A1* | 3/2020 | Jung ........................ G11C 8/18 |

FOREIGN PATENT DOCUMENTS

| | | |
|---|---|---|
| CN | 1856835 A | 1/2006 |
| CN | 104810054 A | 7/2015 |
| CN | 107545915 A | 1/2018 |

* cited by examiner

DATA READING/WRITING CIRCUIT, METHOD, AND DEVICE

CROSS-REFERENCE TO RELATED APPLICATIONS

This application is a continuation application of International Patent Application No. PCT/CN2022/092536, filed on May 12, 2022, which claims priority to Chinese Patent Application No. 202210311931.8, filed with the China National Intellectual Property Administration on Mar. 28, 2022 and entitled "DATA READING/WRITING CIRCUIT, METHOD, AND DEVICE." The above-referenced applications are incorporated herein by reference in their entirety.

TECHNICAL FIELD

This invention relates to but is not limited to a data reading/writing circuit, method, and device.

BACKGROUND

In the semiconductor field, data is stored in a memory, as data may be written into the memory or read from the memory. The data reading/writing process needs to be controlled by a controller. The controller is usually implemented as a system on chip (SOC). When performing reading/writing, the controller needs to rely on a write clock signal (WCK). Correspondingly, when performing an instruction reading/writing process, the memory needs to rely on another clock signal (CK). If the time deviation between the two clock signals is relatively large, a reading/writing error may occur. To ensure correct reading/writing, the two clock signals need to be synchronized.

In the conventional technology, the controller performs clock synchronization on the two clock signals in real time by using one synchronization parameter. The synchronization parameter may be preset, and is used to indicate the time deviation between the two clock signals. For example, if the clock signal WCK is five nanoseconds earlier than the clock signal CK, 5 nanoseconds may be used as the synchronization parameter to delay the WCK by 5 nanoseconds or advance the CK by 5 nanoseconds.

SUMMARY

An embodiment of this invention provides a data reading/writing circuit, including a controller and a memory that are connected to each other. The memory is configured to receive a first clock signal and a second clock signal that are sent by the controller, and the memory is configured to decode an instruction based on the first clock signal and sample data based on the second clock signal.

The controller stores a first synchronization parameter, the memory includes a first storage module, a second storage module, and a mode register, the mode register stores a second synchronization parameter, a second delay circuit is disposed in the second storage module, and the second delay circuit is connected to the mode register.

In a reading/writing process performed on the first storage module, the controller is configured to synchronize the first clock signal and the second clock signal by using the first synchronization parameter.

In a reading/writing process performed on the second storage module, the controller is configured to perform first synchronization on the first clock signal and the second clock signal by using the first synchronization parameter, and the memory is configured to perform, by using the second delay circuit and the second synchronization parameter, second synchronization on the first clock signal and the second clock signal that are sent by the controller.

In some embodiments, another second delay circuit is disposed in the first storage module, and is configured to synchronize, by using the second synchronization parameter corresponding to the first storage module, the first clock signal and the second clock signal that are sent by the controller.

In some embodiments, the second delay circuit is located on a transmission path of the first clock signal, and is configured to receive the first clock signal sent by the controller, and perform delay processing on the received first clock signal based on the second synchronization parameter.

In some embodiments, the memory further includes a deviation measurement circuit respectively connected to the second delay circuit and the mode register, and the deviation measurement circuit is configured to determine a time deviation between the first clock signal and the second clock signal, and adjust the second synchronization parameter in the mode register based on the time deviation.

In some embodiments, the second delay circuit is located on a transmission path of the second clock signal, and is configured to receive the second clock signal sent by the controller, and perform delay processing on the received second clock signal by using the second synchronization parameter.

In some embodiments, the memory further includes a deviation measurement circuit respectively connected to the second delay circuit and the mode register, and the deviation measurement circuit is configured to determine a time deviation between the first clock signal and the second clock signal, and adjust the second synchronization parameter in the mode register based on the time deviation.

In some embodiments, the controller further includes a first delay circuit, configured to synchronize the first clock signal and the second clock signal by using the first synchronization parameter, and the first delay circuit is located on a transmission path of the first clock signal or a transmission path of the second clock signal.

In some embodiments, the second delay circuit includes a decoder circuit, a delay processing circuit, and an output circuit, the decoder circuit is configured to decode the second synchronization parameter to obtain N delay processing signals, where one of the delay processing signals is in a valid state, the delay processing circuit is configured to perform delay processing on a target clock signal input to the second delay circuit by using the delay processing signal in the valid state, and the output circuit is configured to use a target clock signal obtained after the delay processing as an output target clock signal, where the target clock signal is the first clock signal or the second clock signal.

In some embodiments, the delay processing circuit includes N AND gates, each of the AND gates corresponds to one delay processing signal, input of each of the AND gates is the target clock signal and a corresponding delay processing signal, (N-1) AND gates are respectively connected to delayers with different delays, the delayer is configured to perform delay processing on an output signal of the AND gate, the delay processing signal in the valid state corresponds to a target AND gate, and an output signal of the target AND gate or an output signal of a delayer connected to the target AND gate is used as the target clock signal output by the delay processing circuit.

An embodiment of this invention further provides a data reading/writing method, applicable to the foregoing data reading/writing circuit. The method includes: in a reading/writing process performed on the first storage module, synchronizing the first clock signal and the second clock signal by using the first synchronization parameter; and in a reading/writing process performed on the second storage module, synchronizing the first clock signal and the second clock signal by using the first synchronization parameter, and then synchronizing the first clock signal and the second clock signal by using the second synchronization parameter.

In some embodiments, the synchronizing the first clock signal and the second clock signal by using the second synchronization parameter includes: delaying the first clock signal by using the second synchronization parameter, where the second synchronization parameter is a difference between a time deviation corresponding to the second storage module and a time deviation corresponding to the first storage module, the time deviation corresponding to the first storage module is a time deviation between the first clock signal and the second clock signal in the reading/writing process performed on the first storage module, and the time deviation corresponding to the second storage module is a time deviation between the first clock signal and the second clock signal in the reading/writing process performed on the second storage module.

In some embodiments, the synchronizing the first clock signal and the second clock signal by using the second synchronization parameter includes: delaying the second clock signal by using the second synchronization parameter, where the second synchronization parameter is an opposite number of a difference between a time deviation of the second storage module and a time deviation corresponding to the first storage module, the time deviation corresponding to the first storage module is a time deviation between the first clock signal and the second clock signal in the reading/writing process performed on the first storage module, and the time deviation corresponding to the second storage module is a time deviation between the first clock signal and the second clock signal in the reading/writing process performed on the second storage module.

In some embodiments, the synchronizing the first clock signal and the second clock signal by using the first synchronization parameter includes: delaying the first clock signal by using the first synchronization parameter, where the first synchronization parameter is the time deviation of the first storage module.

In some embodiments, the synchronizing the first clock signal and the second clock signal by using the first synchronization parameter includes: delaying the second clock signal by using the first synchronization parameter, where the first synchronization parameter is an opposite number of the time deviation of the first storage module.

An embodiment of this invention further provides a data reading/writing method, applicable to the foregoing data reading/writing circuit. The method includes: in a reading/writing process performed on a target storage module, performing first synchronization on the first clock signal and the second clock signal by using the first synchronization parameter, the target storage module being the first storage module or the second storage module; and after the first synchronization, performing second synchronization on the first clock signal and the second clock signal by using a second synchronization parameter corresponding to the target storage module.

In some embodiments, the performing second synchronization on the first clock signal and the second clock signal by using a second synchronization parameter corresponding to the target storage module includes: delaying the first clock signal by using the second synchronization parameter corresponding to the target storage module, where if the target storage module is a storage module with a largest time deviation, the second synchronization parameter of the target storage module is an absolute difference between a time deviation corresponding to the first storage module and a time deviation of the second storage module; or if the target storage module is a storage module with a smallest time deviation, the second synchronization parameter of the target storage module is 0; and a time deviation of the storage module is a time deviation between the first clock signal and the second clock signal in a reading/writing process performed on the storage module.

In some embodiments, the performing second synchronization on the first clock signal and the second clock signal by using a second synchronization parameter corresponding to the target storage module includes: delaying the second clock signal by using the second synchronization parameter corresponding to the target storage module, where if the target storage module is a storage module with a largest time deviation, the second synchronization parameter of the target storage module is an opposite number of an absolute difference between a time deviation corresponding to the first storage module and a time deviation of the second storage module; or if the target storage module is a storage module with a smallest time deviation, the second synchronization parameter of the target storage module is 0; and a time deviation of the storage module is a time deviation between the first clock signal and the second clock signal in a reading/writing process performed on the storage module.

In some embodiments, the performing first synchronization on the first clock signal and the second clock signal by using the first synchronization parameter includes: delaying the first clock signal by using the first synchronization parameter, where the first synchronization parameter is the smaller value of the time deviation corresponding to the first storage module and the time deviation corresponding to the second storage module.

In some embodiments, the performing first synchronization on the first clock signal and the second clock signal by using the first synchronization parameter includes: delaying the second clock signal by using the first synchronization parameter, where the first synchronization parameter is an opposite number of the smaller value of the time deviation corresponding to the first storage module and the time deviation corresponding to the second storage module.

An embodiment of this invention further provides an electronic device, including the foregoing data reading/writing circuit.

According to the data reading/writing circuit, method, and device provided in the embodiments of this invention, clock synchronization can be implemented by using the first synchronization parameter when reading/writing is performed on the first storage module, and clock synchronization can be implemented through superposition of the first synchronization parameter and the second synchronization parameter when reading/writing is performed on the second storage module. In other words, a synchronization parameter used when reading/writing is performed on the first storage module is the first synchronization parameter, and a synchronization parameter used when reading/writing is performed on the second storage module is a superposed parameter of the first synchronization parameter and the second synchronization parameter. As such, the synchronization parameters of the two storage modules are different. As such, clock synchronization is respectively performed on the first storage module and the second storage module by using different synchronization parameters. Therefore, after the first synchronization parameter and the second synchronization parameter are initially set respectively based on the first storage module and the second storage module, the synchronization parameters do not need to be modified when reading/writing operations are switched among storage modules, so that the complexity of clock synchronization is reduced.

DESCRIPTION OF EMBODIMENTS

The following clearly describes the technical solutions in the embodiments of this invention with reference to the accompanying drawings in the embodiments of this invention. Clearly, the described embodiments are merely some but not all of the embodiments of this invention. All other embodiments obtained by persons of ordinary skill in the art based on the embodiments of this invention without creative efforts shall fall within the protection scope of this invention.

In the specification, claims, and accompanying drawings of this invention, the terms "first", "second", and so on are intended to distinguish between similar objects but do not necessarily indicate a specific order. It should be understood that the data termed in such a way is interchangeable in proper circumstances so that the embodiments of this invention described herein can be implemented in an order other than the order illustrated or described herein.

Moreover, the terms "include", "contain", and any other variants mean to cover the non-exclusive inclusion. For example, a process, method, system, product, or device that includes a list of steps or units is not necessarily limited to those steps or units expressly listed, but may include other steps or units not expressly listed or inherent to such a process, method, product, or device.

Figure 1:
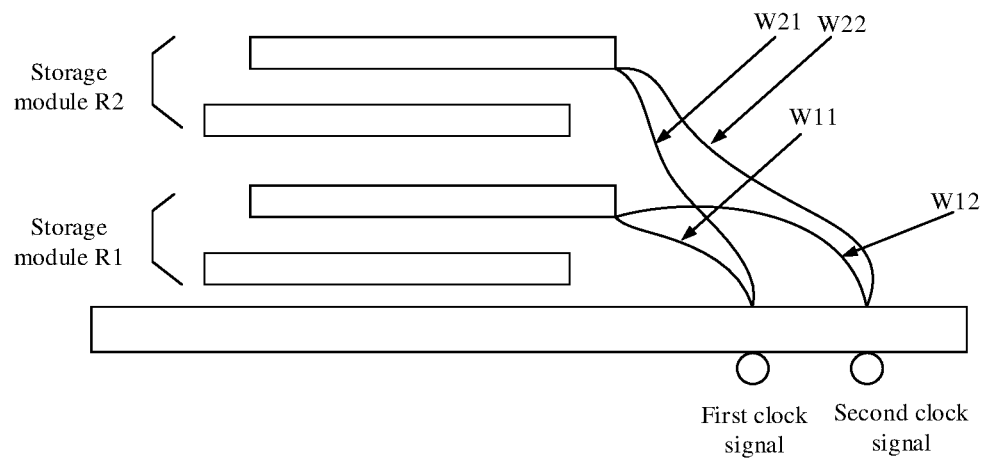
FIG. 1 is a schematic diagram of bounding wires connected to receive clock signals in the case of two storage modules according to an embodiment of this invention.

The inventor of this invention finds that a problem of relatively high clock synchronization complexity exists in the conventional technology when a memory includes two storage modules. After analyzing the conventional technology, the inventor finds that one of the reasons of the technical problem is as follows: Lengths of bounding wires of different storage modules are different. Therefore, time deviations between two clock signals corresponding to different storage modules are different. In this case, different synchronization parameters are used when clock synchronization is performed on different storage modules. FIG. 1 is a schematic diagram of bounding wires connected to receive clock signals in the case of two storage modules according to an embodiment of this invention. As shown in FIG. 1, a storage module R1 obtains a first clock signal by using a bounding wire W11, and the storage module R1 obtains a second clock signal by using a bounding wire W12. A storage module R2 obtains the first clock signal by using a bounding wire W21, and the storage module R2 obtains the second clock signal by using a bounding wire W22. As can be seen from FIG. 1, a length difference between W11 and W12 is different from a length difference between W21 and W22, and a time deviation between the two clock signals corresponding to the first storage module is different from a time deviation between the two clock signals corresponding to the second storage module. Therefore, synchronization parameters corresponding to the two storage modules are also different.

In the clock synchronization scenario shown in FIG. 1, if reading/writing needs to be performed on one of the storage modules, a synchronization parameter needs to be set for the storage module to perform clock synchronization on the storage module. When reading/writing is performed on the other storage module, the synchronization parameter needs to be modified to synchronize the clock signals for the other storage module based on the modified synchronization parameter. Thus, if performing data reading/writing process is constantly switched among storage modules, the synchronization parameter needs to be frequently modified, resulting in relatively high clock synchronization complexity.

To resolve the foregoing problem, different synchronization processes need to be set for two storage modules in embodiments of this invention. To implement different synchronization processes, clock synchronization of the two storage modules may be implemented by using two synchronization parameters. Specifically, clock synchronization is performed by using a first synchronization parameter in a reading/writing process performed on a first storage module, and clock synchronization is performed by using the first synchronization parameter and a second synchronization parameter in a reading/writing process performed on a second storage module. As such, different synchronization parameters are used for clock synchronization of the first storage module and clock synchronization of the second storage module, and the first synchronization parameter and the second synchronization parameter are to be initially set, so that when reading/writing operations are switched among storage modules, the first synchronization parameter and the second synchronization parameter do not need to be modified, thereby effectively reducing clock synchronization complexity.

Figure 2:
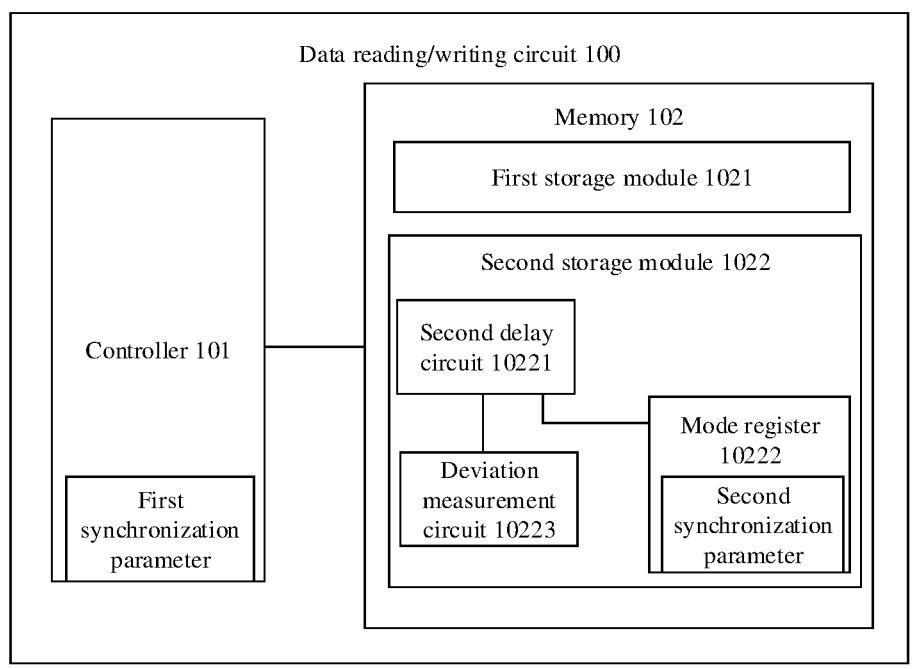
FIG. 2 is a schematic diagram of a structure of a data reading/writing circuit according to an embodiment of this invention.

FIG. 2 is a schematic diagram of a structure of a data reading/writing circuit according to an embodiment of this invention. Referring to FIG. 2, the data reading/writing circuit 100 includes a controller 101 and a memory 102 that are connected to each other. The memory 102 is configured to receive a first clock signal and a second clock signal that are sent by the controller 101, and the memory 102 is configured to decode an instruction based on the first clock signal and sample data based on the second clock signal.

The controller 101 stores a first synchronization parameter, and the first synchronization parameter is used to perform clock synchronization on the first clock signal and the second clock signal in a reading/writing process performed on any storage module. It may be understood that the first clock signal and the second clock signal are generated by the controller 101. Because of a transmission line and a technical problem, a time deviation usually exists between the first clock signal and the second clock signal. Therefore, the first clock signal and the second clock signal need to be synchronized, to minimize the time deviation, so that the time deviation falls within an allowable range.

The memory 102 includes a first storage module 1021 and a second storage module 1022. The second storage module 1022 includes a second delay circuit 10221 and a mode register 10222, the second delay circuit 10221 is connected to the mode register 10222, and the mode register 10222 stores a second synchronization parameter. The second delay circuit 10221 is configured to perform clock synchronization on the first clock signal and the second clock signal by using the second synchronization parameter.

Based on the data reading/writing circuit shown in FIG. 2, in a reading/writing process performed on the first storage module 1021, the controller 101 is configured to synchronize the first clock signal and the second clock signal by using the first synchronization parameter. Reading/writing performed on the first storage module 1021 is reading/writing performed on a storage array 10214 of the first storage module 1021.

In a reading/writing process performed on the second storage module 1022, the controller 101 is configured to perform first synchronization on the first clock signal and the second clock signal by using the first synchronization parameter, and the memory 102 is configured to perform, by using the second delay circuit 10221 and the second synchronization parameter, second synchronization on the first clock signal and the second clock signal that are sent by the controller 101. Reading/writing performed on the second storage module 1022 is reading/writing performed on a storage array 10224 of the second storage module 1022.

It can be seen that the controller 101 performs clock synchronization once in the reading/writing process performed on the first storage module 1021. In the reading/writing process performed on the second storage module 1022, the controller 101 performs clock synchronization once, and in addition, the memory 102 further needs to perform clock synchronization once by using the second delay circuit 10221. In the reading/writing process performed on the first storage module 1021 or the second storage module 1022, the controller 101 uses the same first synchronization parameter to perform synchronization.

Figure 3:
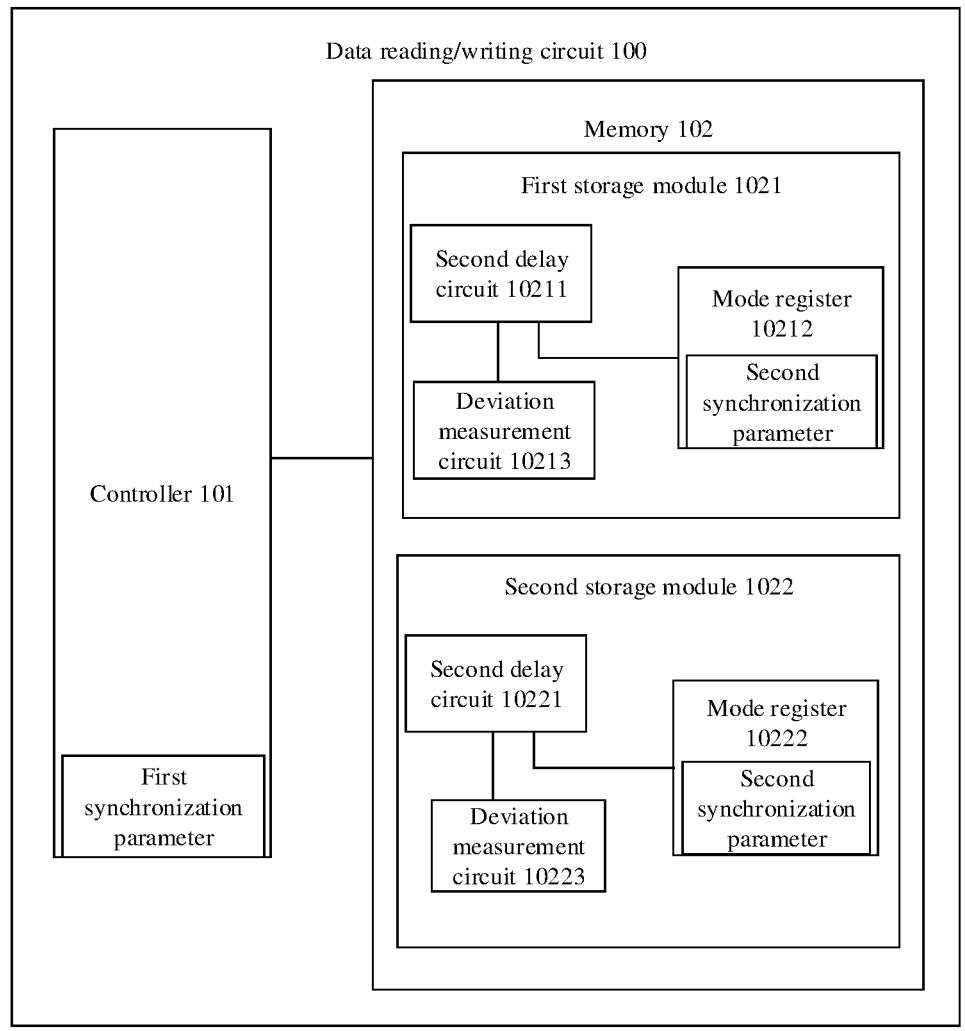
FIG. 3 is a schematic diagram of a structure of another data reading/writing circuit according to an embodiment of this invention.

In some embodiments, as shown in FIG. 3, a second delay circuit 10211 and a mode register 10212 may also be disposed on the first storage module 1021. Structures of the first storage module 1021 and the second storage module 1022 are the same, and corresponding second delay circuits have a same structure. Correspondingly, the mode register 10212 of the first storage module 1021 is configured to store a second synchronization parameter of the first storage module 1021, and the mode register 10222 of the second storage module 1022 is configured to store the second synchronization parameter of the second storage module 1022, so that the first storage module 1021 can synchronize, by using the second synchronization parameter of the first storage module 1021, the first clock signal and the second clock signal that are sent by the controller 101; or the second storage module 1022 synchronizes, by using the second synchronization parameter of the second storage module 1022, the first clock signal and the second clock signal that are sent by the controller 101.

It can be seen that based on the data reading/writing circuit shown in FIG. 3, the controller 101 uses the same first synchronization parameter for the first storage module 1021 and the second storage module 1022, but the first storage module 1021 and the second storage module 1022 respectively use different second synchronization parameters. When both the first synchronization parameter and the second synchronization parameter corresponding to the first storage module 1021 exist and are not 0, clock synchronization in the reading/writing process performed on the first storage module 1021 is superposition of clock synchronization performed by the controller 101 and clock synchronization performed by the memory 102. When both the first synchronization parameter and the second synchronization parameter corresponding to the second storage module 1022 exist and are not 0, clock synchronization in the reading/writing process performed on the second storage module 1022 is superposition of clock synchronization performed by the controller 101 and clock synchronization performed by the memory 102.

It is worthwhile to note that because the circuit structures shown in FIG. 2 and FIG. 3 are different, the first synchronization parameter used by the circuit in FIG. 2 and the first synchronization parameter used by the circuit in FIG. 3 may be different. Correspondingly, the second synchronization parameter used by the circuit in FIG. 2 and the second synchronization parameter used by the circuit in FIG. 3 may also be different. For a setting process of the first synchronization parameter and the second synchronization parameter, references can be made to detailed descriptions in the following method embodiments.

Both the second delay circuit 10211 corresponding to the first storage module 1021 and the second delay circuit 10221 corresponding to the second storage module 1022 are configured to perform clock synchronization on the first clock signal and the second clock signal, and delay principles of the two delay circuits are the same.

Specifically, in the reading/writing process performed on the first storage module 1021, the second delay circuit 10211 corresponding to the first storage module 1021 may be configured to delay the first clock signal or the second clock signal. When the second delay circuit 10211 corresponding to the first storage module 1021 is located on a transmission path of the first clock signal, the second delay circuit 10211 corresponding to the first storage module 1021 is configured to receive the first clock signal sent by the controller 101, and perform delay processing on the received first clock signal based on the second synchronization parameter. When the second delay circuit 10211 corresponding to the first storage module 1021 is located on a transmission path of the second clock signal, the second delay circuit 10211 corresponding to the first storage module 1021 is configured to receive the second clock signal sent by the controller 101, and perform delay processing on the received second clock signal based on the second synchronization parameter.

Similarly, in the reading/writing process performed on the second storage module 1022, the second delay circuit 10221 corresponding to the second storage module 1022 may be configured to delay the first clock signal or the second clock signal. When the second delay circuit 10221 corresponding to the second storage module 1022 is located on a transmission path of the first clock signal, the second delay circuit 10221 corresponding to the second storage module 1022 is configured to receive the first clock signal sent by the controller 101, and perform delay processing on the received first clock signal based on the second synchronization parameter. When the second delay circuit 10221 corresponding to the second storage module 1022 is located on a transmission path of the second clock signal, the second delay circuit 10221 corresponding to the second storage module 1022 is configured to receive the second clock signal sent by the controller 101, and perform delay processing on the received second clock signal based on the second synchronization parameter.

It can be seen that the second delay circuit in this embodiment of the present disclosure may be flexibly disposed. As such, the second delay circuit may be disposed on the transmission path of the first clock signal or the transmission path of the second clock signal based on an actual application scenario. For example, the second delay circuit 10211 corresponding to the first storage module 1021 may be disposed on the transmission path of the first clock signal, and the second delay circuit 10221 corresponding to the second storage module 1022 may be disposed on the transmission path of the second clock signal.

Figure 4:
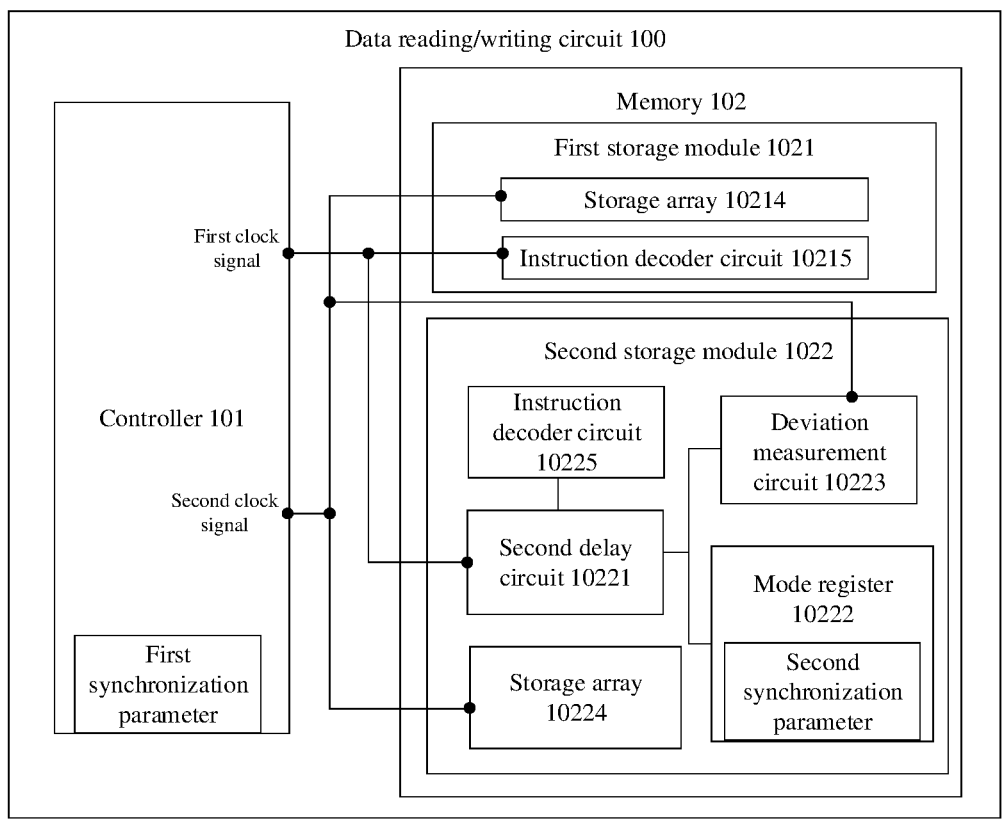
FIG. 4 is a schematic diagram of a structure of a data reading/writing circuit where one second delay circuit is located on a transmission path of a first clock signal according to an embodiment of this invention.

Based on the data reading/writing circuit shown in FIG. 2, FIG. 4 is a schematic diagram of a structure of a data reading/writing circuit when one second delay circuit is located on the transmission path of the first clock signal according to an embodiment of this invention. As shown in FIG. 4, the second delay circuit 10221 is located on the transmission path of the first clock signal, and is configured to perform delay processing on the first clock signal in the reading/writing process performed on the second storage module 1022, to implement clock synchronization between the first clock signal and the second clock signal. The first storage module 1021 further includes the storage array 10214 and an instruction decoder circuit 10215. Correspondingly, the second storage module 1022 also includes the storage array 10224 and an instruction decoder circuit 10225, and the instruction decoder circuit 10225 of the second storage module 1022 is connected to the second delay circuit 10221. The storage array is configured to sample data and read/write data by using the second clock signal. The instruction decoder circuit is configured to decode an instruction by using the second clock signal.

Based on the circuit shown in FIG. 4, in the reading/writing process performed on the second storage module 1022, a transmission process of the first clock signal may include the following: First, the controller 101 sends the first clock signal to the second delay circuit 10221. Then the second delay circuit 10221 performs delay processing on the first clock signal by using the second synchronization parameter. Finally, the second delay circuit 10221 sends a delayed first clock signal to the instruction decoder circuit 10225 of the second storage module 1022, so that the instruction decoder circuit 10225 of the second storage module 1022 decodes an instruction based on the first clock signal.

Based on the circuit shown in FIG. 4, in the reading/writing process performed on the second storage module 1022, a transmission process of the second clock signal may be as follows: The controller 101 sends the second clock signal to the storage array 10224 of the second storage module 1022, so that the storage array 10224 of the second storage module 1022 samples data based on the second clock signal.

Figure 5:
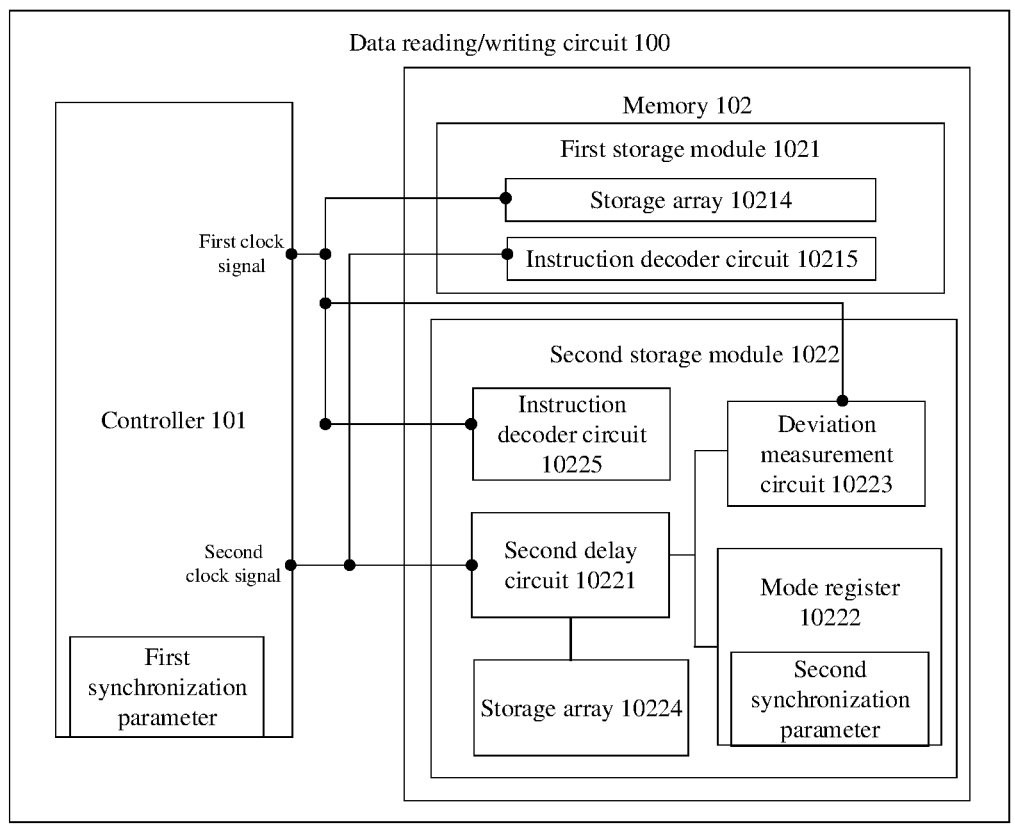
FIG. 5 is a schematic diagram of a structure of a data reading/writing circuit where one second delay circuit is located on a transmission path of a second clock signal according to an embodiment of this invention.

Based on the data reading/writing circuit shown in FIG. 2, FIG. 5 is a schematic diagram of a structure of a data reading/writing circuit when one second delay circuit is located on the transmission path of the second clock signal according to an embodiment of this invention. As shown in FIG. 5, the second delay circuit 10221 is located on the transmission path of the first clock signal, and is configured to perform delay processing on the second clock signal in the reading/writing process performed on the second storage module 1022, to implement clock synchronization between the first clock signal and the second clock signal.

Based on the circuit shown in FIG. 5, in the reading/writing process performed on the second storage module 1022, a transmission process of the first clock signal may be as follows: The controller 101 sends the first clock signal to the second storage module 1022 of the memory 102, so that the second storage module 1022 decodes an instruction based on the first clock signal.

Based on the circuit shown in FIG. 5, in the reading/writing process performed on the second storage module 1022, a transmission process of the second clock signal may include the following: First, the controller 101 sends the second clock signal to the second delay circuit 10221. Then the second delay circuit 10221 performs delay processing on the second clock signal by using the second synchronization parameter. Finally, the second delay circuit 10221 sends a delayed second clock signal to the storage array 10224 of the second storage module 1022, so that the storage array 10224 of the second storage module 1022 samples data based on the second clock signal.

In addition, based on the circuit shown in FIG. 4 or FIG. 5, in the reading/writing process performed on the first storage module 1021, the controller 101 sends the first clock signal to the instruction decoder circuit 10215 of the first storage module 1021, so that the instruction decoder circuit 10215 of the first storage module 1021 decodes the first clock signal, and the controller 101 sends the second clock signal to the storage array 10214 of the first storage module 1021, so that the storage array 10214 of the first storage module 1021 samples data based on the second clock signal.

Figure 6:
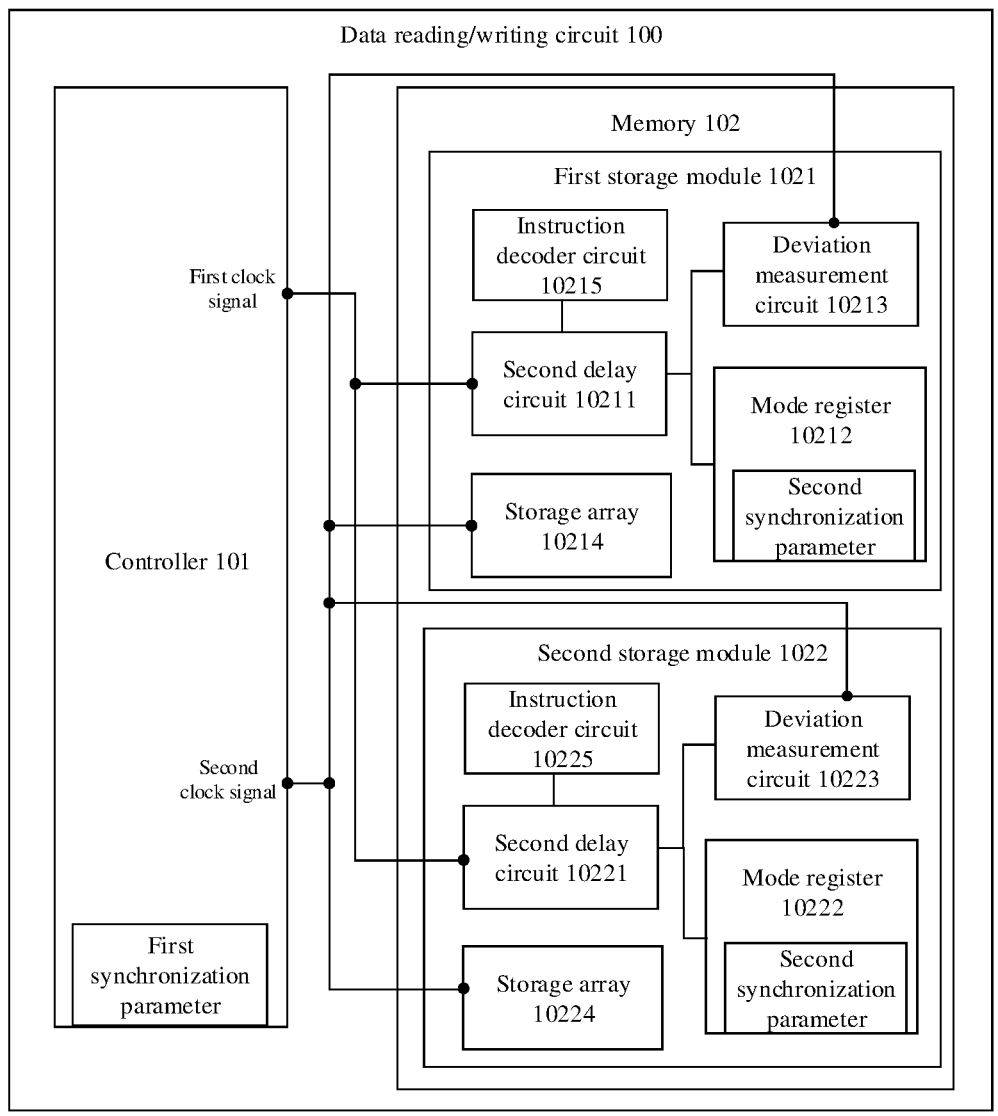
FIG. 6 is a schematic diagram of a structure of a data reading/writing circuit where two second delay circuits are located on a transmission path of a first clock signal according to an embodiment of this invention.

Based on the data reading/writing circuit shown in FIG. 3, FIG. 6 is a schematic diagram of a structure of a data reading/writing circuit when two second delay circuits are located on the transmission path of the first clock signal according to an embodiment of this invention. As shown in FIG. 6, both the second delay circuits are located on the transmission path of the first clock signal, and are configured to perform delay processing on the first clock signal in the reading/writing process performed on the first storage module 1021 or the second storage module 1022, to implement clock synchronization between the first clock signal and the second clock signal.

Based on the circuit shown in FIG. 6, in the reading/writing process performed on the first storage module 1021, a transmission process of the first clock signal may include the following: First, the controller 101 sends the first clock signal to the second delay circuit 10211 corresponding to the first storage module 1021. Then the second delay circuit 10211 of the first storage module 1021 performs delay processing on the first clock signal by using the second synchronization parameter corresponding to the first storage module 1021. Finally, the second delay circuit 10211 of the first storage module 1021 sends a delayed first clock signal to the instruction decoder circuit 10215 of the first storage module 1021, so that the instruction decoder circuit 10215 of the first storage module 1021 decodes an instruction based on the first clock signal.

Based on the circuit shown in FIG. 6, in the reading/writing process performed on the second storage module 1022, a transmission process of the first clock signal may include the following: First, the controller 101 sends the first clock signal to the second delay circuit 10221 corresponding to the second storage module 1022. Then the second delay circuit 10221 corresponding to the second storage module 1022 performs delay processing on the first clock signal. Finally, the second delay circuit 10221 of the second storage module 1022 sends a delayed first clock signal to the instruction decoder circuit 10225 of the second storage module 1022, so that the instruction decoder circuit 10225 of the second storage module 1022 decodes an instruction based on the first clock signal.

Based on the circuit shown in FIG. 6, in the reading/writing process performed on the first storage module 1021, the controller 101 sends the second clock signal to the storage array 10214 of the first storage module 1021, so that the storage array 10214 of the first storage module 1021 samples data based on the second clock signal.

Based on the circuit shown in FIG. 6, in the reading/writing process performed on the second storage module 1022, the controller 101 sends the second clock signal to the storage array 10224 of the second storage module 1022, so that the storage array 10224 of the second storage module 1022 samples data based on the second clock signal.

Figure 7:
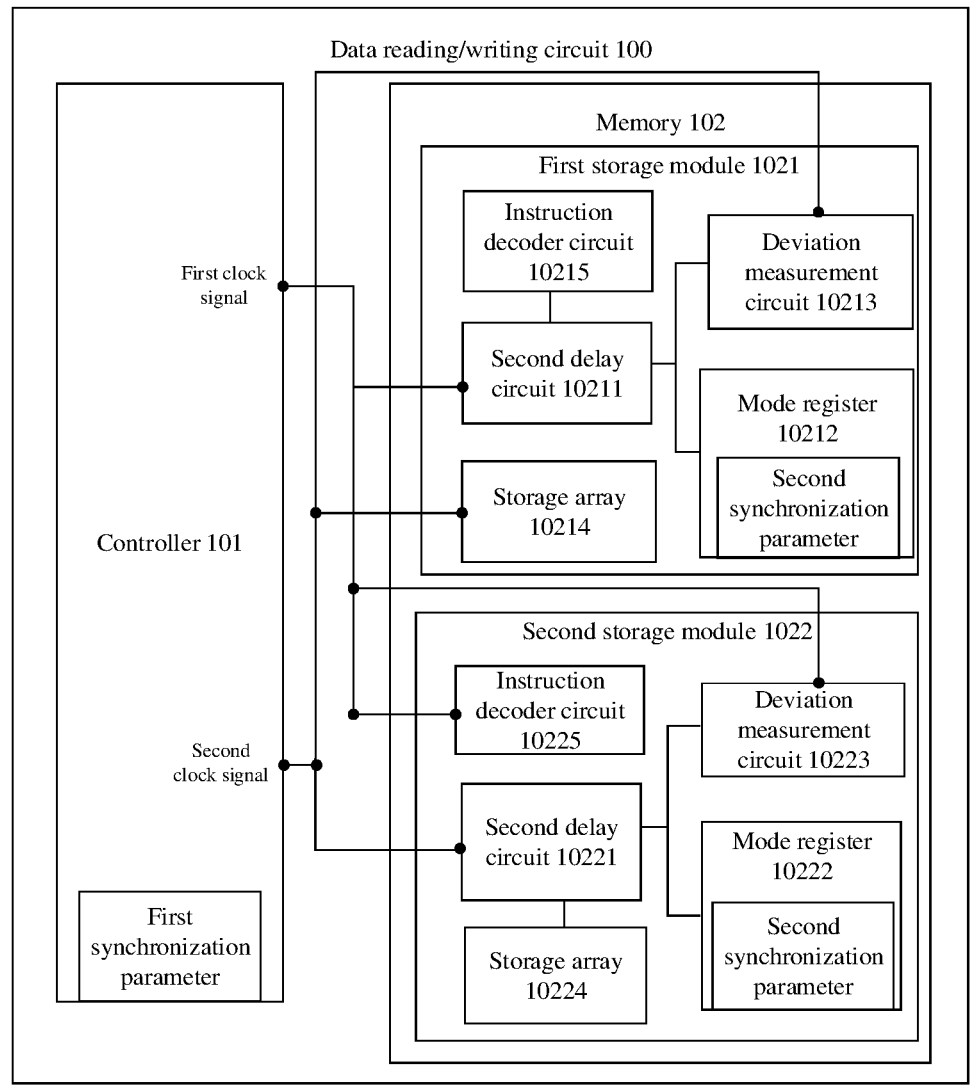
FIG. 7 and FIG. 8 are schematic diagrams of structures of two data reading/writing circuits where two second delay circuits are located on transmission paths of different clock signals according to embodiments of this invention.

Based on the data reading/writing circuit shown in FIG. 3, FIG. 7 is a schematic diagram of a structure of a data reading/writing circuit when two second delay circuits are located on transmission paths of different clock signals according to an embodiment of this invention. As shown in FIG. 7, the second delay circuit 10211 of the first storage module 1021 is located on the transmission path of the first clock signal, and is configured to perform delay processing on the first clock signal in the reading/writing process performed on the first storage module 1021, to implement clock synchronization between the first clock signal and the second clock signal. The second delay circuit 10221 of the second storage module 1022 is located on the transmission path of the second clock signal, and is configured to perform delay processing on the second clock signal in the reading/writing process performed on the second storage module 1022, to implement clock synchronization between the first clock signal and the second clock signal.

Based on the circuit shown in FIG. 7, in the reading/writing process performed on the first storage module 1021, a transmission process of the first clock signal may include the following: First, the controller 101 sends the first clock signal to the second delay circuit 10211 corresponding to the first storage module 1021. Then the second delay circuit 10211 of the first storage module 1021 performs delay processing on the first clock signal by using the second synchronization parameter corresponding to the first storage module 1021. Finally, the second delay circuit 10211 of the first storage module 1021 sends a delayed first clock signal to the instruction decoder circuit 10215 of the first storage module 1021, so that the instruction decoder circuit 10215 of the first storage module 1021 decodes an instruction based on the first clock signal.

Based on the circuit shown in FIG. 7, in the reading/writing process performed on the second storage module 1022, a transmission process of the second clock signal may include the following: First, the controller 101 sends the second clock signal to the second delay circuit 10221 corresponding to the second storage module 1022. Then the second delay circuit 10221 corresponding to the second storage module 1022 performs delay processing on the second clock signal. Finally, the second delay circuit 10221 of the second storage module 1022 sends a delayed second clock signal to the storage array 10224 of the second storage module 1022, so that the storage array 10224 of the second storage module 1022 samples data based on the second clock signal.

Based on the circuit shown in FIG. 7, in the reading/writing process performed on the first storage module 1021, the controller 101 sends the second clock signal to the storage array 10214 of the first storage module 1021, so that the storage array 10214 of the first storage module 1021 samples data based on the second clock signal.

Based on the circuit shown in FIG. 7, in the reading/writing process performed on the second storage module 1022, the controller 101 sends the first clock signal to the instruction decoder circuit 10225 of the second storage module 1022, so that the instruction decoder circuit 10225 of the second storage module 1022 decodes an instruction based on the first clock signal.

Figure 8:
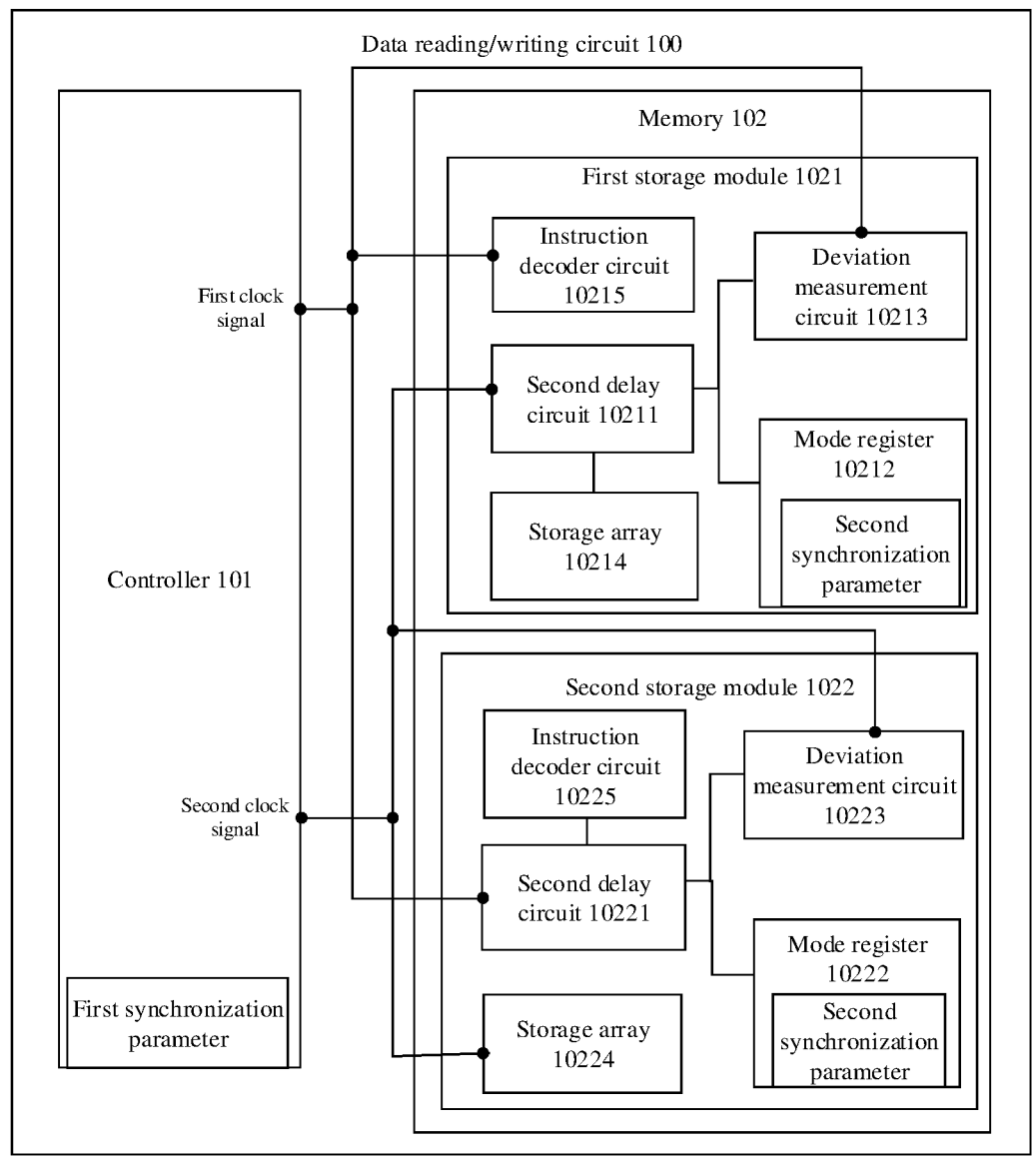

Based on the data reading/writing circuit shown in FIG. 3, FIG. 8 is a schematic diagram of a structure of another data reading/writing circuit when two second delay circuits are located on transmission paths of different clock signals according to an embodiment of this invention. As shown in FIG. 8, the second delay circuit 10211 of the first storage module 1021 is located on the transmission path of the second clock signal, and is configured to perform delay processing on the second clock signal in the reading/writing process performed on the first storage module 1021, to implement clock synchronization between the first clock signal and the second clock signal. The second delay circuit 10221 of the second storage module 1022 is located on the transmission path of the first clock signal, and is configured to perform delay processing on the first clock signal in the reading/writing process performed on the second storage module 1022, to implement clock synchronization between the first clock signal and the second clock signal.

Based on the circuit shown in FIG. 8, in the reading/writing process performed on the first storage module 1021, a transmission process of the second clock signal may include the following: First, the controller 101 sends the second clock signal to the second delay circuit 10211 corresponding to the first storage module 1021. Then the second delay circuit 10211 corresponding to the first storage module 1021 performs delay processing on the second clock signal. Finally, the second delay circuit 10211 of the first storage module 1021 sends a delayed second clock signal to the storage array 10214 of the first storage module 1021, so that the storage array 10214 of the first storage module 1021 samples data based on the second clock signal.

Based on the circuit shown in FIG. 8, in the reading/writing process performed on the second storage module 1022, a transmission process of the first clock signal may include the following: First, the controller 101 sends the first clock signal to the second delay circuit 10221 corresponding to the second storage module 1022. Then the second delay circuit 10221 of the second storage module 1022 performs delay processing on the first clock signal by using the second synchronization parameter corresponding to the second storage module 1022. Finally, the second delay circuit 10221 of the second storage module 1022 sends a delayed first clock signal to the instruction decoder circuit 10225 of the second storage module 1022, so that the instruction decoder circuit 10225 of the second storage module 1022 decodes an instruction based on the first clock signal.

Based on the circuit shown in FIG. 8, in the reading/writing process performed on the first storage module 1021, the controller 101 sends the first clock signal to the instruction decoder circuit 10215 of the first storage module 1021, so that the instruction decoder circuit 10215 of the first storage module 1021 decodes an instruction based on the first clock signal.

Based on the circuit shown in FIG. 8, in the reading/writing process performed on the second storage module 1022, the controller 101 sends the second clock signal to the storage array 10224 of the second storage module 1022, so that the storage array 10224 of the second storage module 1022 samples data based on the second clock signal.

Figure 9:
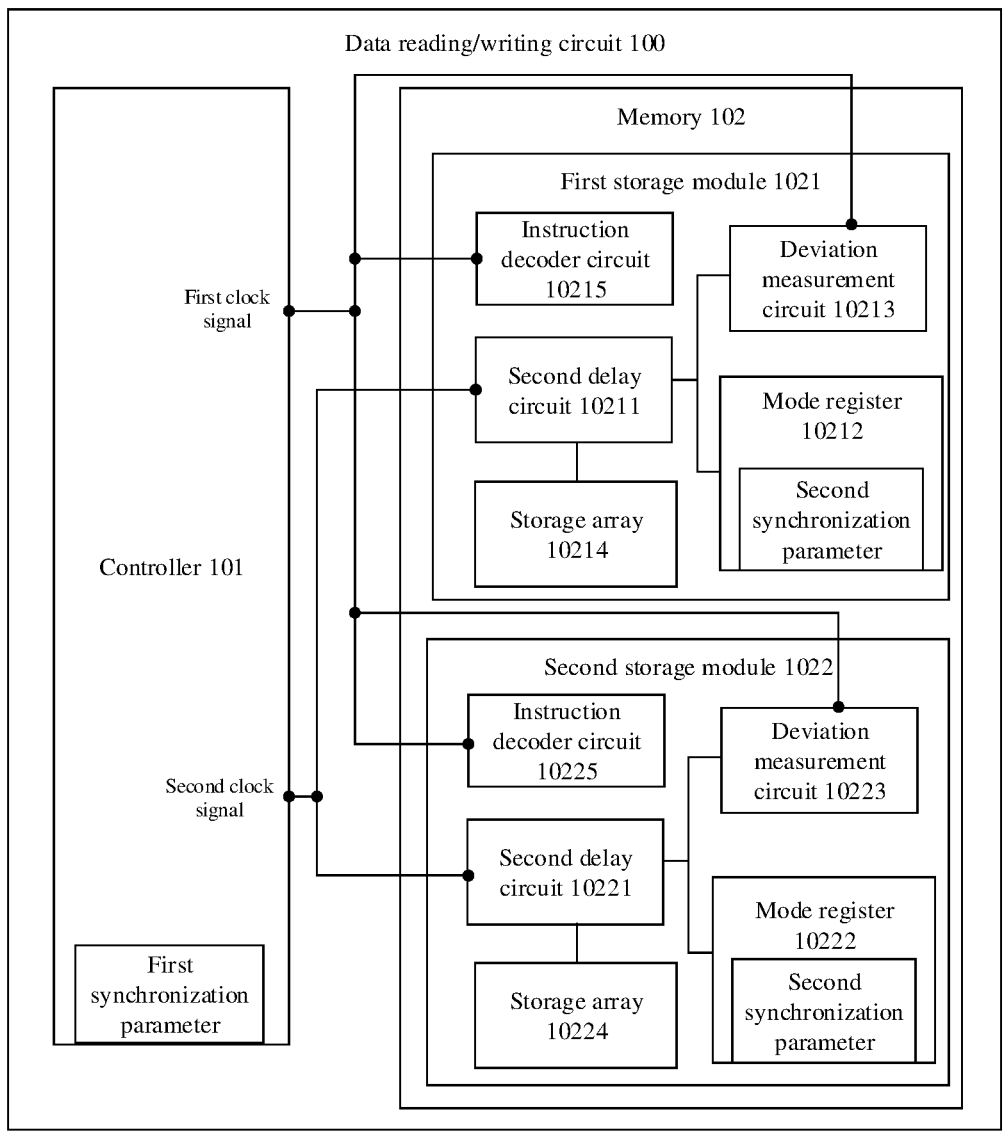
FIG. 9 is a schematic diagram of a structure of a data reading/writing circuit where two second delay circuits are located on a transmission path of a second clock signal according to an embodiment of this invention.

Based on the data reading/writing circuit shown in FIG. 3, FIG. 9 is a schematic diagram of a structure of a data reading/writing circuit when two second delay circuits are located on the transmission path of the second clock signal according to an embodiment of this invention. As shown in FIG. 9, the two second delay circuits are located on the transmission path of the second clock signal, and are configured to perform delay processing on the second clock signal in the reading/writing process performed on the first storage module 1021 or the second storage module 1022, to implement clock synchronization between the first clock signal and the second clock signal.

Based on the circuit shown in FIG. 9, in the reading/writing process performed on the first storage module 1021, a transmission process of the second clock signal may include the following: First, the controller 101 sends the second clock signal to the second delay circuit 10211 corresponding to the first storage module 1021. Then the second delay circuit 10211 corresponding to the first storage module 1021 performs delay processing on the second clock signal. Finally, the second delay circuit 10211 of the first storage module 1021 sends a delayed second clock signal to the storage array 10214 of the first storage module 1021, so that the storage array 10214 of the first storage module 1021 samples data based on the second clock signal.

Based on the circuit shown in FIG. 9, in the reading/writing process performed on the second storage module 1022, a transmission process of the first clock signal may include the following: First, the controller 101 sends the second clock signal to the second delay circuit 10221 corresponding to the second storage module 1022. Then the second delay circuit 10221 corresponding to the second storage module 1022 performs delay processing on the second clock signal. Finally, the second delay circuit 10221 of the second storage module 1022 sends a delayed second clock signal to the storage array 10224 of the second storage module 1022, so that the storage array 10224 of the second storage module 1022 samples data based on the second clock signal.

Based on the circuit shown in FIG. 9, in the reading/writing process performed on the first storage module 1021, the controller 101 sends the first clock signal to the instruction decoder circuit 10215 of the first storage module 1021, so that the instruction decoder circuit 10215 of the first storage module 1021 decodes an instruction based on the first clock signal.

Based on the circuit shown in FIG. 9, in the reading/writing process performed on the second storage module 1022, the controller 101 sends the first clock signal to the instruction decoder circuit 10225 of the second storage module 1022, so that the instruction decoder circuit 10225 of the second storage module 1022 decodes an instruction based on the first clock signal.

It is worthwhile to note that in the foregoing data reading/writing circuits shown in FIG. 2 to FIG. 9, the second synchronization parameter of the first storage module 1021 or the second synchronization parameter of the second storage module 1022 may be 0. Therefore, when the second synchronization parameter is 0, a second delay circuit of a corresponding storage module can determine, by using the second synchronization parameter 0, that the first clock signal does not need to be delayed.

Certainly, a corresponding mode register may be alternatively empty, in other words, no second synchronization parameter exists, which represents a scenario where the second synchronization parameter is 0. In this scenario, a corresponding second delay circuit does not delay the first clock signal by default.

In the running processes of the foregoing circuits shown in FIG. 2 to FIG. 9, a time deviation between the first clock signal and the second clock signal further needs to be measured, to adjust the first synchronization parameter and the second synchronization parameter based on the time deviation. Therefore, a deviation measurement circuit may be further disposed in the circuits shown in FIG. 2 to FIG. 9, and is configured to determine the time deviation between the first clock signal and the second clock signal, and adjust the second synchronization parameter in the mode register based on the time deviation. As such, in this embodiment of the present disclosure, the second synchronization parameter can be dynamically adjusted by using the deviation measurement circuit, so that accuracy of the second synchronization parameter is improved, thereby further improving accuracy of clock synchronization.

As shown in FIG. 2, a deviation measurement circuit 10223 is disposed in the second storage module 1022, and is connected to the second delay circuit 10221. Certainly, a deviation measurement circuit may also be disposed in the first storage module 1021, and to simplify FIG. 2, the deviation measurement circuit is not shown in FIG. 2. Deviation measurement circuits may be disposed in FIG. 4 and FIG. 5 in the manner of FIG. 2.

As shown in FIG. 3, a deviation measurement circuit 10213 and a deviation measurement circuit 10223 are respectively disposed in the first storage module 1021 and the second storage module 1022, and are respectively connected to corresponding second delay circuits. Deviation measurement circuits may be disposed in FIG. 4 and FIG. 5 in the manner of FIG. 2. Deviation measurement circuits may be disposed in FIG. 6 to FIG. 9 in the manner of FIG. 3.

For the circuit shown in FIG. 2, FIG. 4, or FIG. 5, the deviation measurement circuit 10213 of the first storage module 1021 may be connected to the controller 101, and is configured to: in the reading/writing process performed on the first storage module 1021, receive the first clock signal and the second clock signal that are sent by the controller 101, and measure the time deviation between the first clock signal and the second clock signal.

For the circuit shown in FIG. 4, the deviation measurement circuit 10223 of the second storage module 1022 is respectively connected to the second delay circuit 10221 and the controller 101, and is configured to: in the reading/writing process performed on the second storage module 1022, receive a first clock signal obtained after the delaying performed by the second delay circuit 10221 and the second clock signal sent by the controller 101, and measure a time deviation between a first clock signal obtained after the delaying performed by the second delay circuit 10221 and the second clock signal sent by the controller 101.

For the circuit shown in FIG. 5, the deviation measurement circuit 10223 of the second storage module 1022 is respectively connected to the second delay circuit 10221 and the controller 101, and is configured to: in the reading/writing process performed on the second storage module 1022, receive a second clock signal obtained after the delaying performed by the second delay circuit 10221 and the first clock signal sent by the controller 101, and measure a time deviation between a second clock signal obtained after the delaying performed by the second delay circuit 10221 and the first clock signal sent by the controller 101.

For the circuit shown in FIG. 6, in each storage module, the deviation measurement circuit is connected to the controller 101 and a corresponding second delay circuit. In the reading/writing process performed on the first storage module 1021 or the second storage module 1022, a corresponding deviation measurement circuit is configured to receive a first clock signal obtained after the delaying performed by the second delay circuit and the second clock signal sent by the controller 101, and measure a time deviation between a first clock signal obtained after the delaying performed by the second delay circuit and the second clock signal sent by the controller 101.

For the circuit shown in FIG. 7, in each storage module, the deviation measurement circuit is connected to the controller 101 and a corresponding second delay circuit. The deviation measurement circuit 10213 of the first storage module 1021 is configured to: in the reading/writing process performed on the first storage module 1021, receive a first clock signal obtained after the delaying performed by the second delay circuit 10211 and the second clock signal sent by the controller 101, and measure a time deviation between a first clock signal obtained after the delaying performed by the second delay circuit 10211 and the second clock signal sent by the controller 101. The deviation measurement circuit 10223 of the second storage module 1022 is configured to: in the reading/writing process performed on the second storage module 1022, receive a second clock signal obtained after the delaying performed by the second delay circuit 10221 and the first clock signal sent by the controller 101, and measure a time deviation between a second clock signal obtained after the delaying performed by the second delay circuit 10221 and the first clock signal sent by the controller 101.

For the circuit shown in FIG. 8, in each storage module, the deviation measurement circuit is connected to the controller 101 and a corresponding second delay circuit. The deviation measurement circuit 10213 of the first storage module 1021 is configured to: in the reading/writing process performed on the first storage module 1021, receive a second clock signal obtained after the delaying performed by the second delay circuit 10211 and the first clock signal sent by the controller 101, and measure a time deviation between a second clock signal obtained after the delaying performed by the second delay circuit 10211 and the first clock signal sent by the controller 101. The deviation measurement circuit 10223 of the second storage module 1022 is configured to: in the reading/writing process performed on the second storage module 1022, receive a first clock signal obtained after the delaying performed by the second delay circuit 10221 and the second clock signal sent by the controller 101, and measure a time deviation between a first clock signal obtained after the delaying performed by the second delay circuit 10221 and the second clock signal sent by the controller 101.

For the circuit shown in FIG. 9, in each storage module, the deviation measurement circuit is connected to the controller 101 and a corresponding second delay circuit. In the reading/writing process performed on the first storage module 1021 or the second storage module 1022, a corresponding deviation measurement circuit is configured to receive a second clock signal obtained after the delaying performed by the second delay circuit and the first clock signal sent by the controller 101, and measure a time deviation between a second clock signal obtained after the delaying performed by the second delay circuit and the first clock signal sent by the controller 101.

In addition, for any one of the circuits shown in FIG. 2 to FIG. 9, the first storage module 1021 and the second storage module 1022 may share one deviation measurement circuit. As such, two time deviations can be measured by using one deviation measurement circuit, so that a size of the circuit is minimized while accuracy of clock synchronization is ensured.

It can be seen that the foregoing second delay circuit is configured to perform delay processing on an input target clock signal, and the target clock signal may be the foregoing first clock signal or the foregoing second clock signal.

Figure 10:
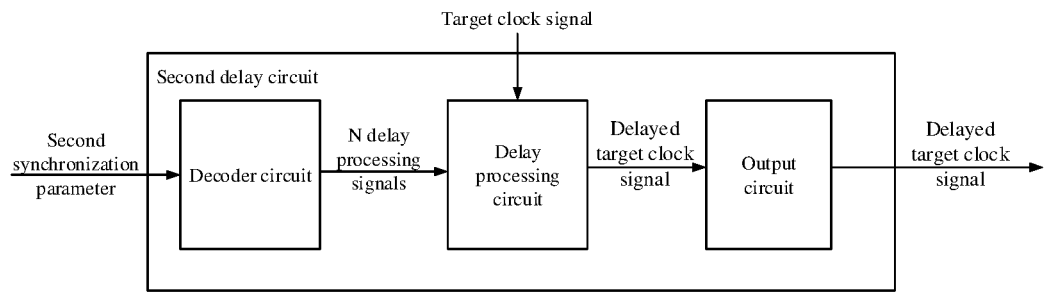
FIG. 10 is a schematic diagram of a structure of a second delay circuit according to an embodiment of this invention.

FIG. 10 is a schematic diagram of a structure of a second delay circuit according to an embodiment of this invention. As shown in FIG. 10, the second delay circuit may include a decoder circuit, a delay processing circuit, and an output circuit. The decoder circuit is configured to decode the second synchronization parameter to obtain N delay processing signals. One of the delay processing signals is in a valid state. The delay processing circuit is configured to perform delay processing on the foregoing target clock signal by using the delay processing signal in the valid state, and output a target clock signal obtained after the delay processing as a new target clock signal.

Figure 11:
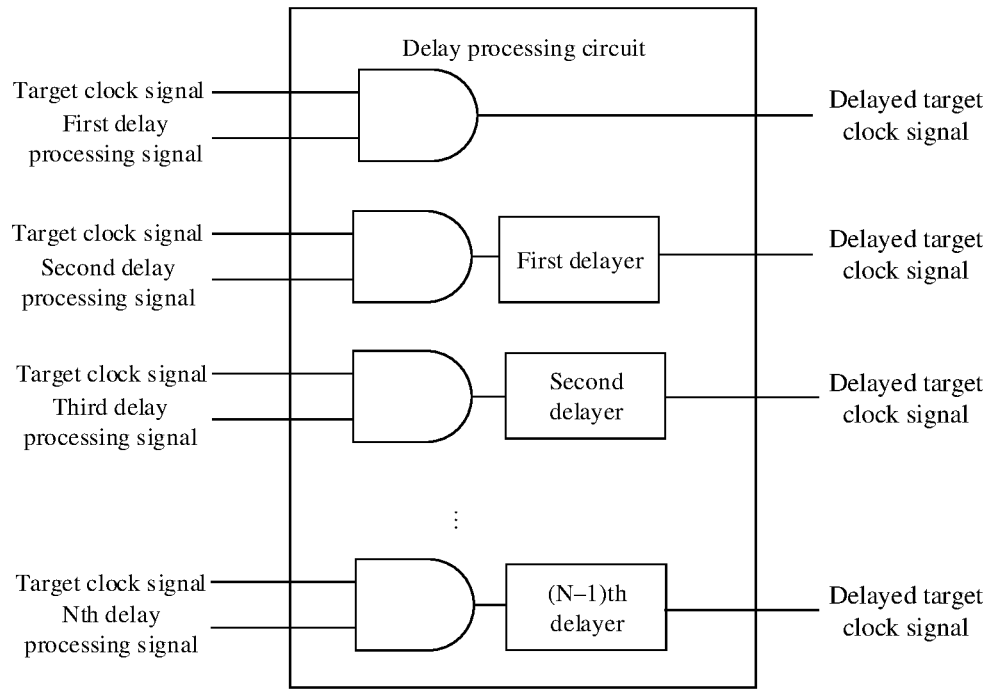
FIG. 11 is a schematic diagram of a structure of a delay processing circuit according to an embodiment of this invention.

FIG. 11 is a schematic diagram of a structure of a delay processing circuit according to an embodiment of this invention. When a valid signal is at a high level, as shown in FIG. 11, the delay processing circuit includes N AND gates, and each of the AND gates corresponds to one delay processing signal. Input of each of the AND gates is a target clock signal and a corresponding delay processing signal, and (N-1) AND gates are respectively connected to delayers with different delays. Each delayer is configured to perform delay processing on an output signal of the AND gate, a delay processing signal in a valid state corresponds to a target AND gate, and an output signal of the target AND gate or an output signal of a delayer connected to the target AND gate is used as the target clock signal output by the delay processing circuit Different delayers correspond to different delay degrees, and different delay degrees may be implemented in two manners.

In Manner 1, different delayers may include one delay unit, and the delay unit included in the different delayers corresponds to different delay durations.

In Manner 2, different delayers may include different quantities of delay units, and delay durations of the delay units are the same. In other words, different delayers implement different delay degrees by using different quantities of delay units.

It can be seen that the foregoing process describes in detail a connection relationship between the second delay circuit in the memory 102 and another circuit in the memory 102. In actual applications, the controller 101 may further include a first delay circuit, configured to synchronize the first clock signal and the second clock signal by using the foregoing first synchronization parameter.

Figure 12:
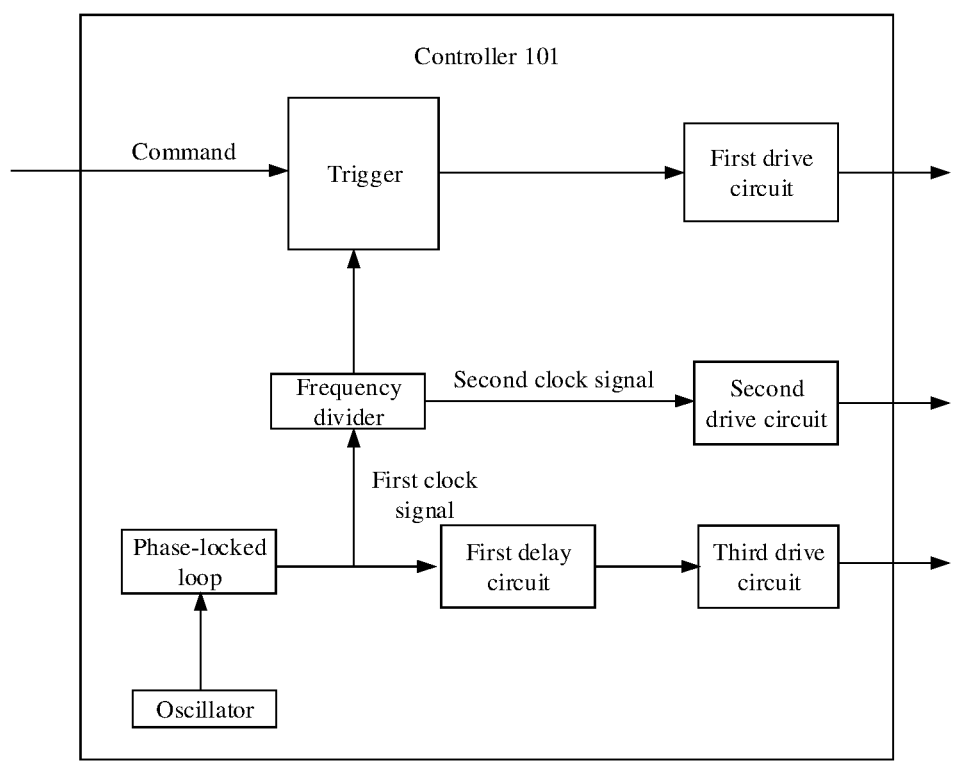
FIG. 12 and FIG. 13 are schematic diagrams of internal structures of two controllers according to embodiments of this invention.

FIG. 12 is a schematic diagram of an internal structure of a controller 101 according to an embodiment of this invention. As shown in FIG. 12, the foregoing first delay circuit is located on a transmission path of a first clock signal. Specifically, as shown in FIG. 12, after an oscillator generates a clock signal, phase locking processing is performed by using a phase-locked loop, and a clock signal obtained after the phase locking processing is the first clock signal. The first delay circuit may be respectively connected to the phase-locked loop and a third drive circuit. As such, the first delay circuit can delay, by using a first synchronization parameter, the first clock signal obtained after the phase locking processing, so that the third drive circuit sends a first clock signal obtained after the delaying to a memory 102.

Figure 13:
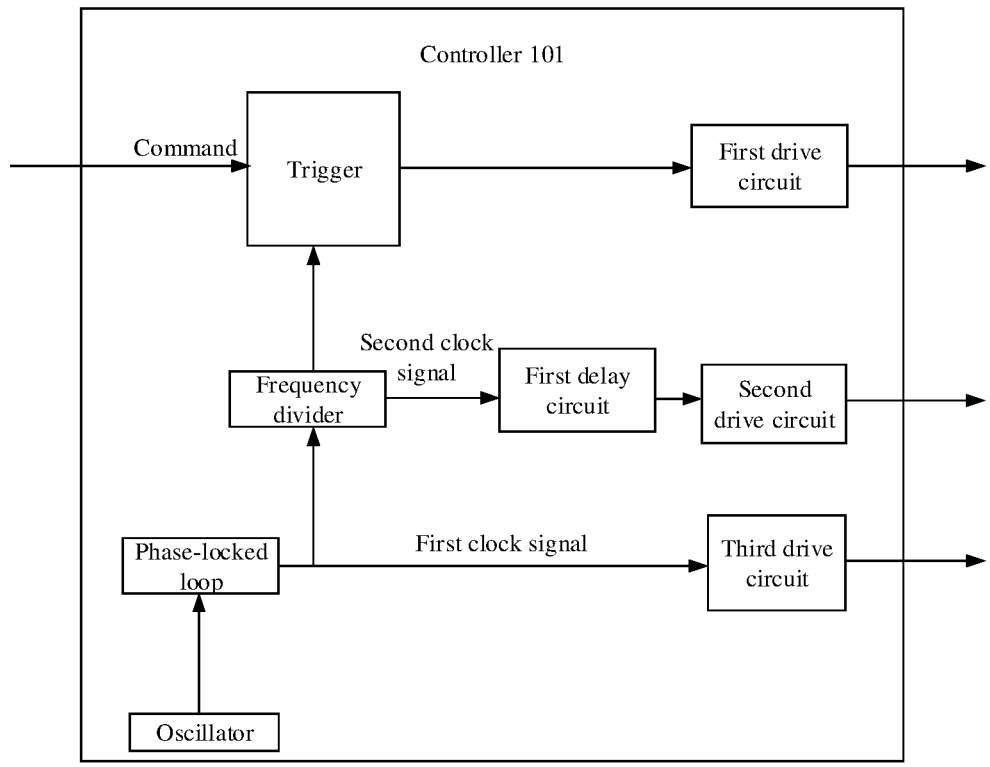

FIG. 13 is a schematic diagram of an internal structure of another controller 101 according to an embodiment of this invention. As shown in FIG. 13, the foregoing first delay circuit is located on a transmission path of a second clock signal. Specifically, as shown in FIG. 13, after an oscillator generates a clock signal, phase locking processing is performed by using a phase-locked loop, and a clock signal obtained after the phase locking processing is a first clock signal. A frequency divider obtains a second clock signal after performing frequency division processing on the first clock signal. The first delay circuit may be respectively connected in series between the frequency divider and a second drive circuit. As such, the first delay circuit can delay, by using a first synchronization parameter, the second clock signal obtained after the frequency division processing, so that the second drive circuit sends a second clock signal obtained after the delaying to a memory 102.

Certainly, the first delay circuit may be alternatively disposed before the frequency divider, so that delay processing is performed before the frequency divider performs frequency division processing to obtain the second clock signal.

In addition, as shown in FIG. 12 or FIG. 13, the controller 101 further includes a trigger and a first drive circuit. The trigger is configured to temporarily store a command, and send the temporarily stored command to the first drive circuit based on the second clock signal, so that the first drive circuit sends the command to the memory 102.

Figure 14:
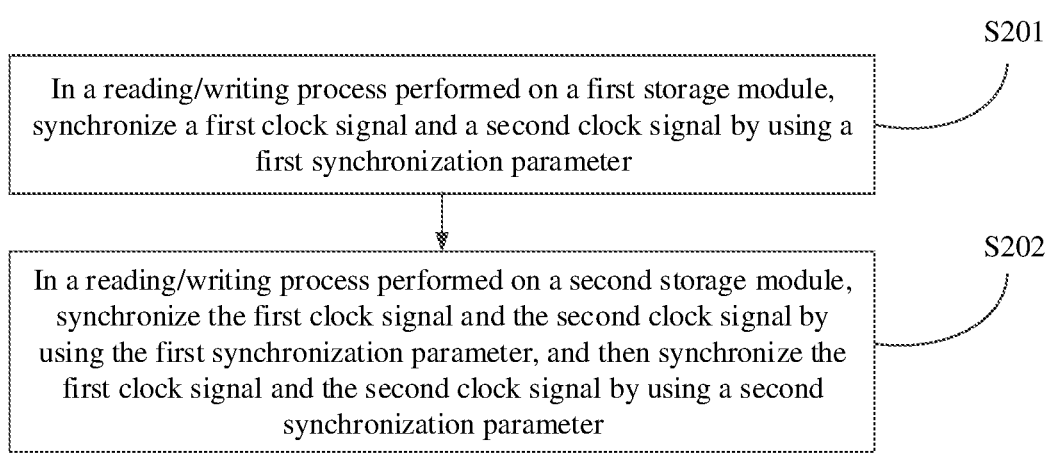
FIG. 14 and FIG. 15 are flowcharts of steps of two data reading/writing methods according to embodiments of this invention.

Corresponding to the foregoing circuit embodiments, FIG. 14 is a flowchart of steps of a data reading/writing method according to an embodiment of this invention. The method shown in FIG. 14 corresponds to the foregoing circuits shown in FIG. 2, FIG. 4, and FIG. 5, in other words, the method is specific to one second delay circuit. Referring to FIG. 14, the data reading/writing method may include steps S201 and S202.

S201: In a reading/writing process performed on a first storage module, synchronize a first clock signal and a second clock signal by using a first synchronization parameter.

Specifically, a first delay circuit may synchronize the first clock signal and the second clock signal by using the first synchronization parameter. Synchronization performed on the first clock signal and the second clock signal may include two types of processing: delay processing performed on the first clock signal by using a first synchronization parameter and delay processing performed on the second clock signal by using the first synchronization parameter.

Certainly, the first synchronization parameter for performing delay processing on the first clock signal is different from the first synchronization parameter for performing delay processing on the second clock signal.

When delay processing is performed on the first clock signal, the first synchronization parameter may be a time deviation corresponding to the first storage module. The time deviation corresponding to the first storage module is a time deviation between the first clock signal and the second clock signal in the reading/writing process performed on the first storage module. When delay processing is performed on the second clock signal, the first synchronization parameter may be an opposite number of the time deviation corresponding to the first storage module.

S202: In a reading/writing process performed on a second storage module, synchronize the first clock signal and the second clock signal by using the first synchronization parameter, and then synchronize the first clock signal and the second clock signal by using a second synchronization parameter.

Specifically, in the reading/writing process performed on the second storage module, first, the first delay circuit in the controller performs delay processing on the first clock signal or the second clock signal by using the same process as in S201. Then the controller sends the first clock signal and a delayed second clock signal to a memory, or sends the second clock signal and a delayed first clock signal to the memory. Finally, a second delay circuit in the memory may delay the first clock signal or the second clock signal by using the second synchronization parameter.

Certainly, a second synchronization parameter for performing delay processing on the first clock signal is different from a second synchronization parameter for performing delay processing on the second clock signal.

When the first clock signal is delayed by using the second synchronization parameter, the second synchronization parameter is a difference between a time deviation corresponding to the second storage module and a time deviation corresponding to the first storage module. When the second clock signal is delayed by using the second synchronization parameter, the second synchronization parameter is an opposite number of the difference between the time deviation of the second storage module and the time deviation corresponding to the first storage module. The time deviation corresponding to the second storage module is a time deviation between the first clock signal and the second clock signal in the reading/writing process performed on the second storage module. The time deviation here may be measured by the foregoing deviation measurement circuit in FIG. 2.

In this embodiment of this invention, clock synchronization can be implemented by using one first synchronization parameter and one second synchronization parameter. The following uses examples for description. A time difference by which the first clock signal is earlier than the second clock signal may be defined as the time deviation between the first clock signal and the second clock signal. That is, if the first clock signal is earlier than the second clock signal, the time deviation is greater than 0. If the first clock signal is later than the second clock signal, the time deviation is less than 0. If the first clock signal and the second clock signal are synchronized, the time deviation is 0.

For example, when the time deviation corresponding to the first storage module is 4 nanoseconds, and the time deviation corresponding to the second storage module is 5 nanoseconds, the first synchronization parameter may be set to 4 nanoseconds, and the second synchronization parameter may be set to 5−4=1 nanosecond.

In the reading/writing process performed on the first storage module, the first delay circuit delays the first clock signal by 4 nanoseconds by using the first synchronization parameter. Before the clock synchronization, the first clock signal is 4 nanoseconds earlier than the second clock signal. Therefore, after the synchronization, the first clock signal and the second clock signal are in a synchronized state.

In the reading/writing process performed on the second storage module, first, the first delay circuit delays the first clock signal by 4 nanoseconds by using the first synchronization parameter, and then the second delay circuit delays the first clock signal by 1 nanosecond by using the second synchronization parameter. In other words, the first clock signal is delayed by a total of 5 nanoseconds. Before the clock synchronization, the first clock signal is 5 nanoseconds earlier than the second clock signal. Therefore, after the synchronization, the first clock signal and the second clock signal are in a synchronized state.

For example, when the time deviation corresponding to the first storage module is 5 nanoseconds, and the time deviation corresponding to the second storage module is 4 nanoseconds, the first synchronization parameter may be set to −5 nanoseconds, and the second synchronization parameter may be set to an opposite number, 1 nanosecond, of 4−5.

In the reading/writing process performed on the first storage module, the first delay circuit advances the second clock signal by 5 nanoseconds by using the first synchronization parameter. Before the clock synchronization, the first clock signal is 5 nanoseconds earlier than the second clock signal. Therefore, after the synchronization, the first clock signal and the second clock signal are in a synchronized state.

In the reading/writing process performed on the second storage module, first, the first delay circuit advances the second clock signal by 5 nanoseconds by using the first synchronization parameter, and then the second delay circuit delays the second clock signal by 1 nanosecond by using the second synchronization parameter. In other words, the second clock signal is advanced by 5 nanoseconds and then delayed by 1 nanosecond, and therefore, the second clock signal is advanced by a total of 4 nanoseconds. Before the clock synchronization, the first clock signal is 4 nanoseconds earlier than the second clock signal. Therefore, after the synchronization, the first clock signal and the second clock signal are in a synchronized state.

In conclusion, in the reading/writing process performed on the first storage module, the time deviation between the first clock signal and the second clock signal is eliminated by using the first synchronization parameter and the first delay circuit, to ensure that the first clock signal and the second clock signal are in the synchronized state, thereby improving reading/writing accuracy of the first storage module. In the reading/writing process performed on the second storage module, the time deviation between the first clock signal and the second clock signal is eliminated by using the first synchronization parameter, the first delay circuit, the second synchronization parameter, and the second delay circuit, to ensure that the first clock signal and the second clock signal are in the synchronized state, thereby improving reading/writing accuracy of the second storage module.

It can be seen that through the foregoing process, after the first synchronization parameter and the second synchronization parameter are set, the first synchronization parameter and the second synchronization parameter may not be modified, regardless of whether reading/writing is performed on the first storage module or the second storage module, so that clock synchronization complexity is reduced.

Figure 15:
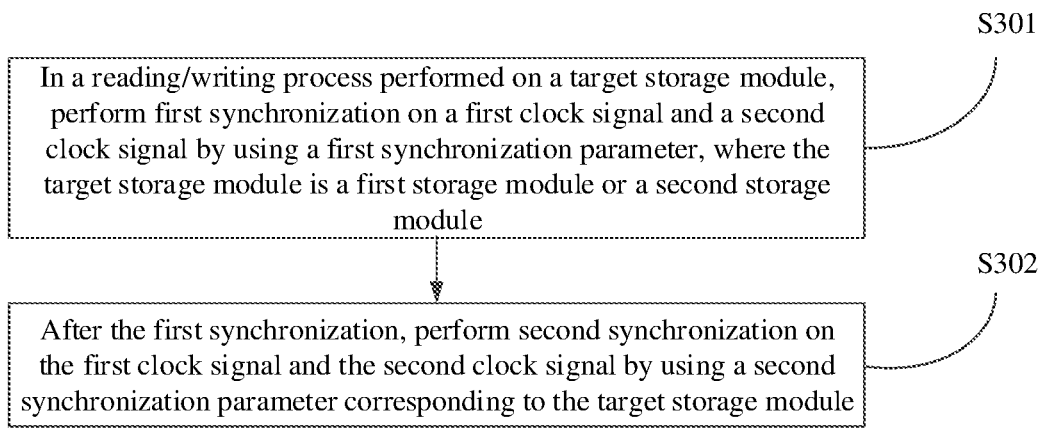

Corresponding to the foregoing circuit embodiments, FIG. 15 is a flowchart of steps of another data reading/writing method according to an embodiment of this invention. The method shown in FIG. 15 corresponds to the foregoing circuits shown in FIG. 3 and FIG. 6 to FIG. 9, in other words, the method is specific to two second delay circuits. Referring to FIG. 15, the data reading/writing method may include steps S301 and S302.

S301: In a reading/writing process performed on a target storage module, perform first synchronization on a first clock signal and a second clock signal by using a first synchronization parameter, where the target storage module is a first storage module or a second storage module.

S302: After the first synchronization, perform second synchronization on the first clock signal and the second clock signal by using a second synchronization parameter corresponding to the target storage module.

It is worthwhile to note that a controller uses the same first synchronization parameter in a reading/writing process performed on the first storage module or the second storage module. The first storage module corresponds to a second synchronization parameter, so that synchronization is performed by using the second synchronization parameter in a reading/writing process performed on the first storage module. The second storage module corresponds to another second synchronization parameter, so that synchronization is performed by using the another second synchronization parameter in a reading/writing process performed on the second storage module. It can be seen that in this embodiment of this invention, when both the first synchronization parameter and the second synchronization parameter exist and are not 0, clock synchronization needs to be performed twice regardless of whether reading/writing is performed on the first storage module or the second storage module. The first synchronization is performed by a first delay circuit by using the first synchronization parameter, and the second synchronization is performed by a second delay circuit by using the second synchronization parameter.

The first synchronization performed by the first delay circuit by using the first synchronization parameter includes two types of processing: delay processing performed on the first clock signal by using a first synchronization parameter and delay processing performed on the second clock signal by using the first synchronization parameter. Similarly, the second synchronization performed by the second delay circuit by using the second synchronization parameter includes two types of processing: delay processing performed on the first clock signal by using a second synchronization parameter and delay processing performed on the second clock signal by using a second synchronization parameter.

Certainly, the first synchronization parameter for performing delay processing on the first clock signal is different from the first synchronization parameter for performing delay processing on the second clock signal. Similarly, the second synchronization parameter for performing delay processing on the first clock signal is different from the second synchronization parameter for performing delay processing on the second clock signal.

When the first clock signal is delayed by using the first synchronization parameter, the first synchronization parameter is the smaller value of a time deviation corresponding to the first storage module and a time deviation corresponding to the second storage module. When the second clock signal is delayed by using the first synchronization parameter, the first synchronization parameter is an opposite number of the smaller value of the time deviation corresponding to the first storage module and the time deviation corresponding to the second storage module.

When the first clock signal is delayed by using the second synchronization parameter, a second synchronization parameter corresponding to each storage module needs to be set based on values of the time deviations corresponding to the two storage modules. A second synchronization parameter of a storage module with the larger time deviation in the first storage module and the second storage module is an absolute difference between the time deviations of the two storage modules, namely, an absolute value of a difference between the time deviations of the two storage modules. A second synchronization parameter of a storage module with the smaller time deviation in the first storage module and the second storage module is 0. For the target storage module, if the target storage module is the storage module with the larger time deviation, a second synchronization parameter of the target storage module is the absolute difference between the time deviation corresponding to the first storage module and the time deviation of the second storage module. If the target storage module is the storage module with the smaller time deviation, a second synchronization parameter of the target storage module is 0.

When the second clock signal is delayed by using the second synchronization parameter, a second synchronization parameter corresponding to each storage module also needs to be set based on values of the time deviations corresponding to the two storage modules. A second synchronization parameter of a storage module with the larger time deviation in the first storage module and the second storage module is an opposite number of an absolute difference between the time deviations of the two storage modules. A second synchronization parameter of a storage module with the smaller time deviation in the first storage module and the second storage module is 0. For the target storage module, if the target storage module is the storage module with the larger time deviation, a second synchronization parameter of the target storage module is the opposite number of the absolute difference between the time deviation corresponding to the first storage module and the time deviation of the second storage module. If the target storage module is the storage module with the smaller time deviation, a second synchronization parameter of the target storage module is 0. The time deviation here may be measured by the foregoing deviation measurement circuit in FIG. 3.

In this embodiment of this invention, clock synchronization can be implemented by using one first synchronization parameter and two second synchronization parameters. The following uses examples for description. Similarly, a time difference by which the first clock signal is earlier than the second clock signal may be defined as the time deviation between the first clock signal and the second clock signal. That is, if the first clock signal is earlier than the second clock signal, the time deviation is greater than 0. If the first clock signal is later than the second clock signal, the time deviation is less than 0. If the first clock signal and the second clock signal are synchronized, the time deviation is 0.

For example, when the time deviation corresponding to the first storage module is 4 nanoseconds, and the time deviation corresponding to the second storage module is 5 nanoseconds, the first synchronization parameter may be set to the smaller value, 4 nanoseconds, of 4 and 5, the second synchronization parameter of the second storage module with the larger time deviation may be set to an absolute difference, 1 nanosecond, between 4 and 5, and the second synchronization parameter of the first storage module with the smaller time deviation may be set to 0.

In the reading/writing process performed on the first storage module, the first delay circuit delays the first clock signal by 4 nanoseconds by using the first synchronization parameter. Because the second synchronization parameter of the first storage module is 0, the second delay circuit does not delay the first storage module, which may also mean that the first storage module is delayed by 0 nanoseconds. Therefore, in this process, the first clock signal is delayed by a total of 4 nanoseconds. Before the clock synchronization, the first clock signal is 4 nanoseconds earlier than the second clock signal. Therefore, after the synchronization, the first clock signal and the second clock signal are in a synchronized state.

In the reading/writing process performed on the second storage module, the first delay circuit delays the first clock signal by 4 nanoseconds by using the first synchronization parameter, and then the second delay circuit delays the first clock signal by 1 nanosecond by using the second synchronization parameter of the second storage module. Therefore, the first clock signal is delayed by a total of 5 nanoseconds. Before the clock synchronization, the first clock signal is 5 nanoseconds earlier than the second clock signal. Therefore, after the synchronization, the first clock signal and the second clock signal are in a synchronized state.

For another example, when the time deviation corresponding to the first storage module is 5 nanoseconds, and the time deviation corresponding to the second storage module is 4 nanoseconds, the first synchronization parameter may be set to an opposite number, −4 nanoseconds, of the smaller value, 4 nanoseconds, of 4 and 5, the second synchronization parameter of the first storage module with the larger time deviation may be set to an opposite number, −1 nanosecond, of an absolute difference, 1 nanosecond, between 4 and 5, and the second synchronization parameter of the second storage module with the smaller time deviation may be set to 0.

In the reading/writing process performed on the first storage module, the first delay circuit advances the second clock signal by 4 nanoseconds by using the first synchronization parameter, −4 nanoseconds, and then the second delay circuit advances the second clock signal by 1 nanosecond by using the second synchronization parameter, −1 nanosecond, of the second storage module. Therefore, in this process, the second clock signal is advanced by a total of 5 nanoseconds. Before the clock synchronization, the first clock signal is 5 nanoseconds earlier than the second clock signal. Therefore, after the synchronization, the first clock signal and the second clock signal are in a synchronized state.

In the reading/writing process performed on the second storage module, the first delay circuit advances the second clock signal by 4 nanoseconds by using the first synchronization parameter, −4 nanoseconds. Because the second synchronization parameter of the second storage module is 0, the second delay circuit does not delay the second storage module, which may also mean that the second storage module is delayed by 0 nanoseconds. Therefore, in this process, the second clock signal is advanced by a total of 4 nanoseconds. Before the clock synchronization, the first clock signal is 4 nanoseconds earlier than the second clock signal. Therefore, after the synchronization, the first clock signal and the second clock signal are in a synchronized state.

It is worthwhile to note that the foregoing examples are merely examples. In actual applications, both the first synchronization parameter and the second synchronization parameter may be positive numbers, or both may be negative numbers, or one of them is a positive number and the other is a negative number, which is not limited in this embodiment of this invention.

The foregoing two method embodiments correspond to the foregoing circuit embodiments, and have the same technical effects as the circuit embodiments. For detailed descriptions of the apparatus embodiments, references can be made to detailed descriptions in the foregoing method embodiments. Details are omitted here for simplicity.

An embodiment of this invention further provides an electronic device, including the foregoing data reading/writing circuit.

Finally, it is worthwhile to note that the foregoing embodiments are merely intended for describing the technical solutions of this invention other than limiting this invention. Although this invention is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of this invention.

For ease of explanation, the foregoing descriptions are provided with reference to specific implementations. However, the foregoing example discussion is not intended to be exhaustive or limit implementations to the foregoing specific form disclosed. According to the foregoing teachings, various modifications and variations may be obtained. The foregoing embodiments are selected and described for the better explanation of the principle and actual application, so that persons skilled in the art better use the implementations and various variations that are considered for specific use.

What is claimed is:

1. A data reading/writing circuit, comprising a controller and a memory that are connected to each other, wherein the memory is configured to receive a first clock signal and a second clock signal that are sent by the controller, and the memory is configured to decode an instruction based on the first clock signal and to sample data based on the second clock signal;
wherein the controller stores a first synchronization parameter, the memory comprises a first storage module, a second storage module, and a mode register, the mode register stores a second synchronization parameter, a second delay circuit is disposed in the second storage module, and the second delay circuit is connected to the mode register;
wherein, in a reading/writing process performed on the first storage module, the controller is configured to synchronize the first clock signal and the second clock signal by using the first synchronization parameter; and
in a reading/writing process performed on the second storage module, the controller is configured to perform first synchronization on the first clock signal and the second clock signal by using the first synchronization parameter, and the memory is configured to perform, by using the second delay circuit and the second synchronization parameter, second synchronization on the first clock signal and the second clock signal that are sent by the controller.

2. The data reading/writing circuit according to claim 1, wherein another second delay circuit is disposed in the first storage module, and is configured to synchronize, by using a second synchronization parameter corresponding to the first storage module, the first clock signal and the second clock signal that are sent by the controller.

3. The data reading/writing circuit according to claim 1, wherein the second delay circuit is located on a transmission path of the first clock signal, and is configured to receive the first clock signal sent by the controller, and perform delay processing on the received first clock signal based on the second synchronization parameter.

4. The data reading/writing circuit according to claim 3, wherein the memory further comprises a deviation measurement circuit connected to the second delay circuit and the mode register, and the deviation measurement circuit is configured to determine a time deviation between the first clock signal and the second clock signal, and adjust the second synchronization parameter in the mode register based on the time deviation.

5. The data reading/writing circuit according to claim 1, wherein the second delay circuit is located on a transmission path of the second clock signal, and is configured to receive the second clock signal sent by the controller, and perform delay processing on the received second clock signal by using the second synchronization parameter.

6. The data reading/writing circuit according to claim 5, wherein the memory further comprises a deviation measurement circuit connected to the second delay circuit and the mode register, and the deviation measurement circuit is configured to determine a time deviation between the first clock signal and the second clock signal, and adjust the second synchronization parameter in the mode register based on the time deviation.

7. The data reading/writing circuit according to claim 1, wherein the controller further comprises a first delay circuit, configured to synchronize the first clock signal and the second clock signal by using the first synchronization parameter, and the first delay circuit is located on a transmission path of the first clock signal or a transmission path of the second clock signal.

8. The data reading/writing circuit according to claim 1, wherein the second delay circuit comprises a decoder circuit, a delay processing circuit, and an output circuit, the decoder circuit is configured to decode the second synchronization parameter to obtain N delay processing signals, wherein one of the delay processing signals is in a valid state, the delay processing circuit is configured to perform delay processing on a target clock signal input to the second delay circuit by using the delay processing signal in the valid state, and the output circuit is configured to use a target clock signal obtained after the delay processing as an output target clock signal, wherein the output target clock signal is the first clock signal or the second clock signal.

9. The data reading/writing circuit according to claim 8, wherein the delay processing circuit comprises N AND gates, each of the AND gates corresponds to one delay processing signal, input of each of the AND gates is the target clock signal and a corresponding delay processing signal, (N-1) AND gates are respectively connected to delayers with different delays, each of the delayers is configured to perform delay processing on an output signal of a corresponding AND gate, the delay processing signal in the valid state corresponds to a target AND gate, and an output signal of the target AND gate or an output signal of a delayer connected to the target AND gate is used as the target clock signal output by the delay processing circuit.

10. A data reading/writing method applicable to a data reading/writing circuit, wherein the data reading/writing circuit comprises a controller and a memory that are connected to each other, wherein the memory is configured to receive a first clock signal and a second clock signal that are sent by the controller, and the memory is configured to decode an instruction based on the first clock signal and to sample data based on the second clock signal;
    wherein the controller stores a first synchronization parameter, the memory comprises a first storage module, a second storage module, and a mode register, the mode register stores a second synchronization parameter, a second delay circuit is disposed in the second storage module, and the second delay circuit is connected to the mode register;
    wherein the method comprises:
    in a reading/writing process performed on the first storage module, synchronizing the first clock signal and the second clock signal by using the first synchronization parameter; and
    in a reading/writing process performed on the second storage module, synchronizing the first clock signal and the second clock signal by using the first synchronization parameter, and then synchronizing the first clock signal and the second clock signal by using the second synchronization parameter.

11. The method according to claim 10, wherein the synchronizing the first clock signal and the second clock signal by using the second synchronization parameter comprises:
    delaying the first clock signal by using the second synchronization parameter, wherein the second synchronization parameter is a difference between a time deviation corresponding to the second storage module and a time deviation corresponding to the first storage module, the time deviation corresponding to the first storage module is a time deviation between the first clock signal and the second clock signal in the reading/writing process performed on the first storage module, and the time deviation corresponding to the second storage module is a time deviation between the first clock signal and the second clock signal in the reading/writing process performed on the second storage module.

12. The method according to claim 10, wherein the synchronizing the first clock signal and the second clock signal by using the second synchronization parameter comprises:
    delaying the second clock signal by using the second synchronization parameter, wherein the second synchronization parameter is an opposite number of a difference between a time deviation corresponding to the second storage module and a time deviation corresponding to the first storage module, the time deviation corresponding to the first storage module is a time deviation between the first clock signal and the second clock signal in the reading/writing process performed on the first storage module, and the time deviation corresponding to the second storage module is a time deviation between the first clock signal and the second clock signal in the reading/writing process performed on the second storage module.

13. The method according to claim 11, wherein the synchronizing the first clock signal and the second clock signal by using the first synchronization parameter comprises:
    delaying the first clock signal by using the first synchronization parameter, wherein the first synchronization parameter is the time deviation corresponding to the first storage module.

14. The method according to claim 11, wherein the synchronizing the first clock signal and the second clock signal by using the first synchronization parameter comprises:
    delaying the second clock signal by using the first synchronization parameter, wherein the first synchronization parameter is an opposite number of the time deviation corresponding to the first storage module.

15. A data reading/writing method applicable to a data reading/writing circuit, wherein the data reading/writing circuit comprises a controller and a memory that are connected to each other, wherein the memory is configured to receive a first clock signal and a second clock signal that are sent by the controller, and the memory is configured to decode an instruction based on the first clock signal and to sample data based on the second clock signal;
    wherein the controller stores a first synchronization parameter, the memory comprises a first storage module, a second storage module, and a mode register, the mode register stores a second synchronization parameter, a second delay circuit is disposed in the second storage module, and the second delay circuit is connected to the mode register;
    wherein another second delay circuit is disposed in the first storage module, and is configured to synchronize, by using a second synchronization parameter corresponding to the first storage module, the first clock signal and the second clock signal that are sent by the controller;
    wherein the method comprises:
    in a reading/writing process performed on a target storage module, performing first synchronization on the first clock signal and the second clock signal by using the first synchronization parameter, the target storage module being the first storage module or the second storage module; and
    after the first synchronization, performing second synchronization on the first clock signal and the second clock signal by using a second synchronization parameter corresponding to the target storage module.

16. The method according to claim 15, wherein the performing second synchronization on the first clock signal and the second clock signal by using a second synchronization parameter corresponding to the target storage module comprises:
    delaying the first clock signal by using the second synchronization parameter corresponding to the target storage module, wherein if the target storage module is a storage module with a largest time deviation, the second synchronization parameter of the target storage module is an absolute difference between a time deviation corresponding to the first storage module and a time deviation corresponding to the second storage module; or if the target storage module is a storage module with a smallest time deviation, the second synchronization parameter of the target storage module is 0; and a time deviation corresponding to a respective storage module is a time deviation between the first clock signal and the second clock signal in a reading/writing process performed on the respective storage module.

17. The method according to claim 15, wherein the performing second synchronization on the first clock signal and the second clock signal by using a second synchronization parameter corresponding to the target storage module comprises:

delaying the second clock signal by using the second synchronization parameter corresponding to the target storage module, wherein if the target storage module is a storage module with a largest time deviation, the second synchronization parameter of the target storage module is an opposite number of an absolute difference between a time deviation corresponding to the first storage module and a time deviation corresponding to the second storage module; or if the target storage module is a storage module with a smallest time deviation, the second synchronization parameter of the target storage module is 0; and a time deviation corresponding to a respective storage module is a time deviation between the first clock signal and the second clock signal in a reading/writing process performed on the respective storage module.

18. The method according to claim 16, wherein the performing first synchronization on the first clock signal and the second clock signal by using the first synchronization parameter comprises:

delaying the first clock signal by using the first synchronization parameter, wherein the first synchronization parameter is the smaller value of the time deviation corresponding to the first storage module and the time deviation corresponding to the second storage module.

19. The method according to claim 16, wherein the performing first synchronization on the first clock signal and the second clock signal by using the first synchronization parameter comprises:

delaying the second clock signal by using the first synchronization parameter, wherein the first synchronization parameter is an opposite number of the smaller value of the time deviation corresponding to the first storage module and the time deviation corresponding to the second storage module.

* * * * *